United States Patent
Smith et al.

(10) Patent No.: US 10,134,989 B2
(45) Date of Patent: Nov. 20, 2018

(54) OPTICAL DISCS AS LOW-COST, QUASI-RANDOM NANOIMPRINTING TEMPLATES FOR PHOTON MANAGEMENT

(71) Applicant: Northwestern University, Evanston, IL (US)

(72) Inventors: Alexander James Smith, Chicago, IL (US); Chen Wang, Evanston, IL (US); Jiaxing Huang, Wilmette, IL (US); Cheng Sun, Wilmette, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 15/696,769

(22) Filed: Sep. 6, 2017

(65) Prior Publication Data

US 2018/0013065 A1    Jan. 11, 2018

Related U.S. Application Data

(62) Division of application No. 14/839,112, filed on Aug. 28, 2015, now Pat. No. 9,786,845.

(60) Provisional application No. 62/043,696, filed on Aug. 29, 2014.

(51) Int. Cl.
*H01L 51/00*  (2006.01)
*H01L 51/44*  (2006.01)

(52) U.S. Cl.
CPC .......... *H01L 51/0014* (2013.01); *H01L 51/44* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2011/0068351 A1* | 3/2011 | Donofrio | H01L 33/0095 257/77 |
| 2011/0163336 A1* | 7/2011 | Peng | G02B 5/1861 257/98 |
| 2012/0105962 A1* | 5/2012 | Fattal | G02B 5/08 359/575 |

* cited by examiner

*Primary Examiner* — Michelle Mandala
(74) *Attorney, Agent, or Firm* — Bell & Manning, LLC

(57) ABSTRACT

Photonic devices are provided comprising a photoactive layer and at least one additional layer, wherein a surface of the photoactive layer or a surface of the at least one additional layer has imprinted thereon a quasi-random pattern of nanostructures corresponding to a quasi-random pattern of nanostructures defined in a recording layer of a pre-written optical media disc. Methods of patterning a layer of a photonic device are also provided.

13 Claims, 35 Drawing Sheets

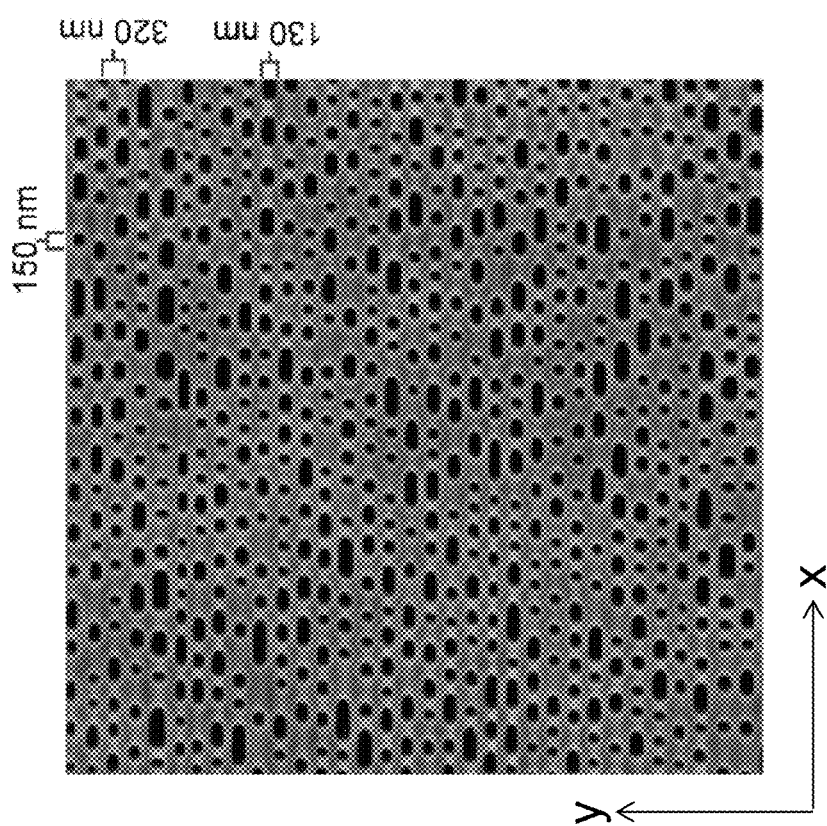
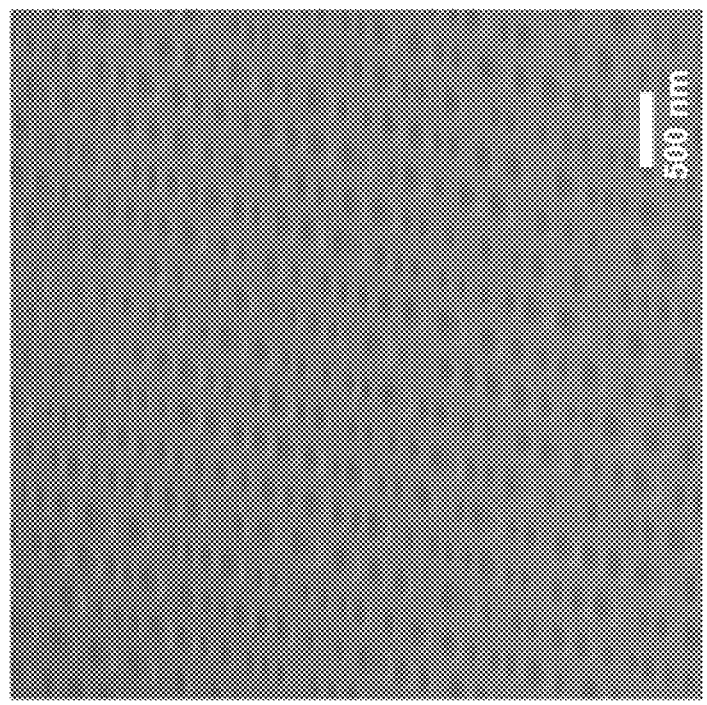
FIG. 4B
FIG. 4A

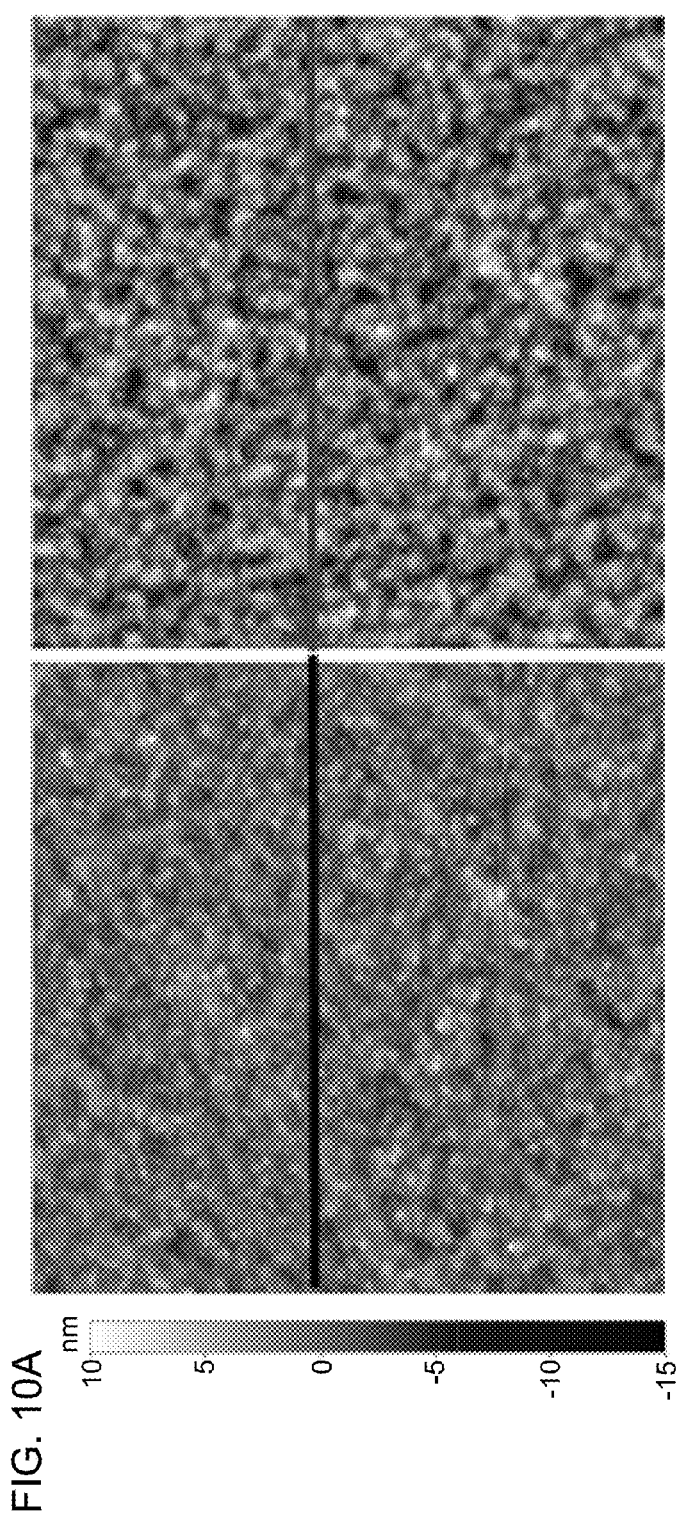
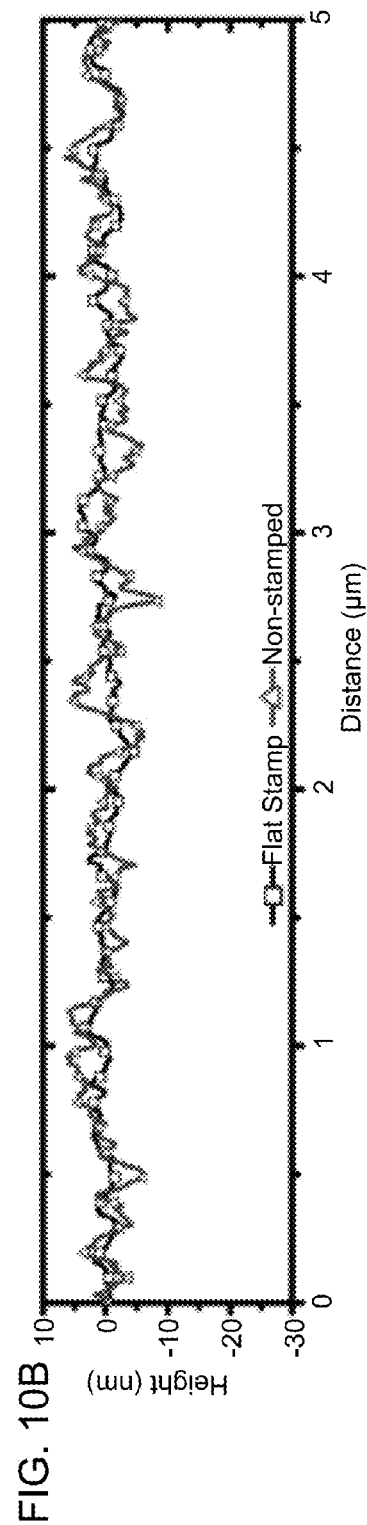
FIG. 10A
FIG. 10B

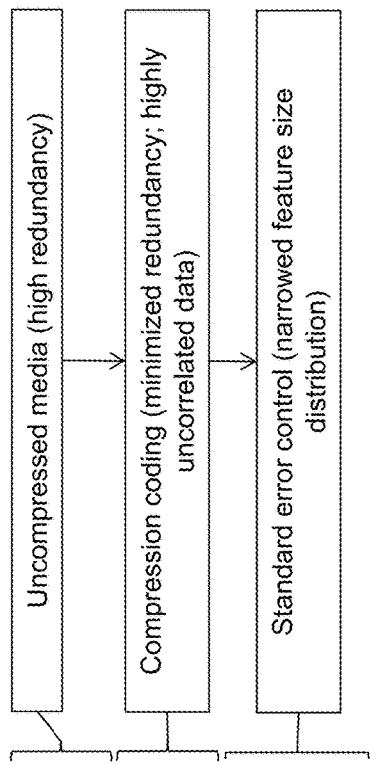
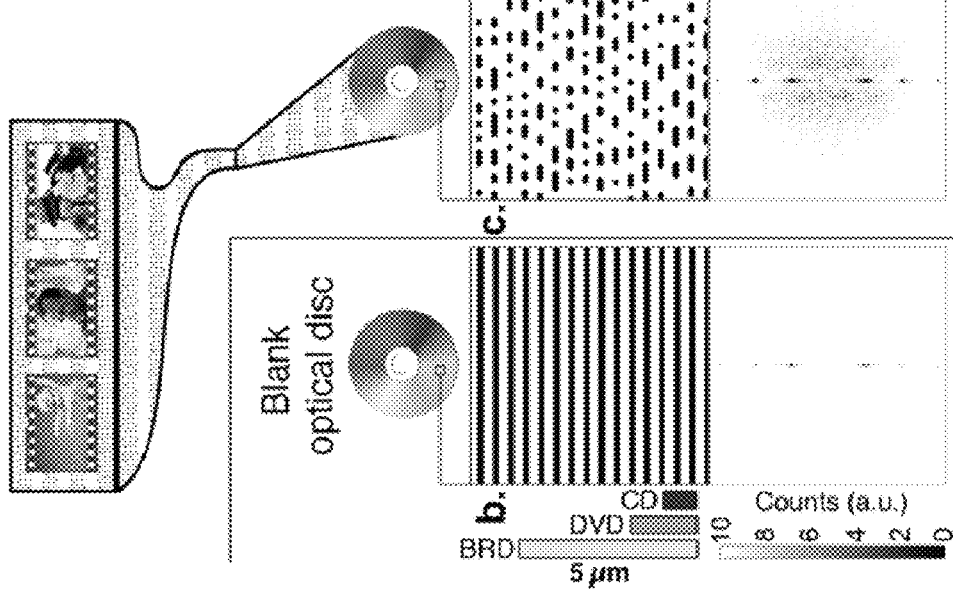
FIG. 11A
FIG. 11B
FIG. 11C

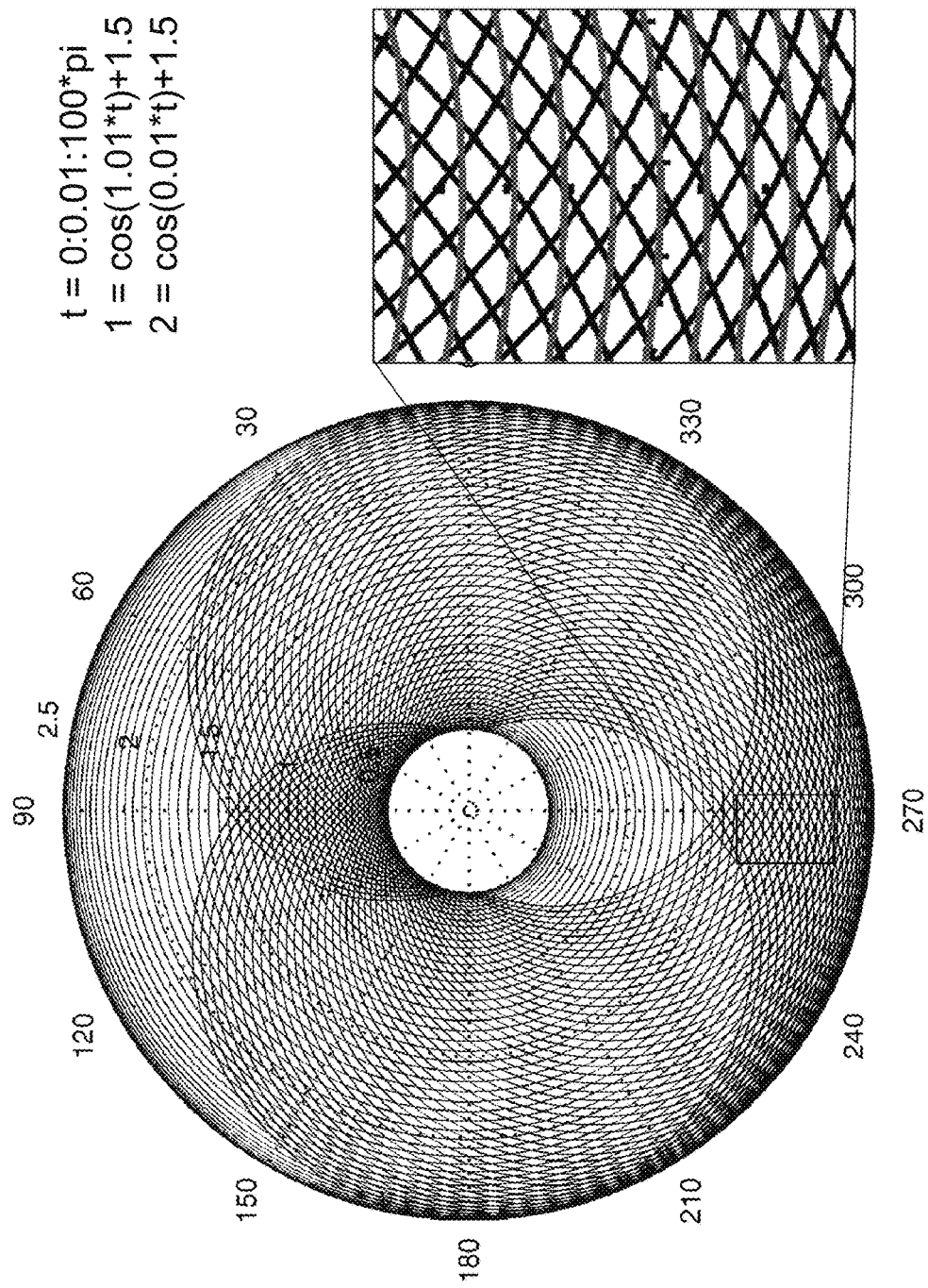

US 10,134,989 B2

OPTICAL DISCS AS LOW-COST, QUASI-RANDOM NANOIMPRINTING TEMPLATES FOR PHOTON MANAGEMENT

CROSS-REFERENCE TO RELATED APPLICATIONS

This application is a divisional of U.S. patent application Ser. No. 14/839,112 filed on Aug. 28, 2015, the entire contents of which are hereby incorporated by reference; which claims priority from U.S. Provisional Patent Application No. 62/043,696 filed on Aug. 29, 2014, the entire contents of which are hereby incorporated by reference.

REFERENCE TO GOVERNMENT RIGHTS

This invention was made with government support under grant numbers CMMI1130407 and CMMI1130640 awarded by the National Science Foundation. The government has certain rights in the invention.

BACKGROUND

Disrupting the ordering of periodic structures results in so-called quasi-random photonic structures, which can provide significant flexibility when engineering the optical response of materials[1-4]. Random and quasi-random photonic structures are abundant in many species in nature[5-7] and have been adopted for diverse engineering applications, such as highly-efficient photon extraction in light-emitting diodes[8], biomimetic structural coloration[5,9], and random lasing[10,11]. Quasi-random nanostructures are advantageous for light trapping in thin film solar cells because, unlike perfectly periodic[12-16] or totally random structures, they can offer both broadband absorption enhancement and customizable spectral response for different photoactive materials[4,17-19]. Subwavelength disordered nanostructures are typically custom-made via advanced lithography over a limited area.

SUMMARY

Provided are methods for patterning a layer of a photonic device using stamps derived from optical media discs. The stamps, the photonic devices comprising the patterned layer, and related methods are also provided.

In one aspect, a method of patterning a layer of a photonic device is provided, the method comprising pressing a stamp on a surface of a layer of a photonic device, the stamp comprising a stamping surface which defines a negative replica of a quasi-random pattern of nanostructures defined in a recording layer of a pre-written optical media disc, for a period of time sufficient to imprint the quasi-random pattern of nanostructures defined in the recording layer of the pre-written optical media disc onto the surface of the layer of the photonic device; and removing the stamp.

In another aspect, a photonic device is provided, the photonic device comprising a photoactive layer and at least one additional layer, wherein a surface of the photoactive layer or the at least one additional layer has a quasi-random pattern of nanostructures defined therein, the quasi-random pattern of nanostructures substantially matching a quasi-random pattern of nanostructures defined in a recording layer of a pre-written optical media disc.

Methods of patterning a layer of a photonic device using photolithographic masks, the photolithographic masks, and the photonic devices formed using the photolithographic masks are also provided.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

FIGS. 1A (a periodic pattern) and 1B (a random pattern) yield wavevectors that either too discretized or too diffuse to lie between the two circles, in contrast to FIG. 1C, which shows an optimized quasi-random pattern. FIG. 1D shows a Blu-ray pattern, obtained by thresholding an AFM image of the recording layer of a movie disc (see FIGS. 3A-3C), produces close-to-optimized distribution of k-values.

FIG. 2A shows a schematic diagram of the process for: (top left) delaminating a Blu-ray Disc and casting a PDMS mold on the exposed recording layer; (bottom left) fabricating the nanopatterned solar cells; and (middle right) imprinting the active layer using the nanopatterned PDMS mold and evaporating the MoO$_3$/Ag electrode. FIG. 2B shows an AFM image of the nanopatterned PDMS mold. FIG. 2C shows a schematic diagram of the solar cell architecture used in the numerical and experimental portions of Example 1.

FIG. 3A shows AFM images of the active layer without stamping (top left) and after stamping with a Blu-ray patterned mold (top right). The horizontal line profiles (bottom) illustrate the depth contrast of the Blu-ray patterned active layer when compared to the non-patterned device. FIG. 3B shows optical images of a half-patterned solar cell showing iridescent scattering due to the periodic nature of the Blu-ray pattern (top) and non-iridescent, broadband scattering from the non-patterned half (bottom). FIG. 3C shows reflected absorption (1-R) measurements from typical Blu-ray patterned and non-patterned solar cells.

FIGS. 4A-4C show the Blu-ray Disc format and structure. FIG. 4A shows an AFM image and FIG. 4B shows a SEM image of a delaminated, read-only Blu-ray movie disc showing the superimposed periodicity (x-axis) and randomness (y-axis) of the pits. Scale bar, 500 nm. FIG. 4C shows a schematic illustrating the cross-section structure of a read-only Blu-ray disc and the corresponding optical readout system.

FIG. 7A shows a schematic of the thin film polymer solar cell used in the 1-dimensional simulation. FIG. 7B shows an AFM image of the recording layer of a Blu-ray disc. The four lines were used as a representative example of the quasi-random structure. FIGS. 7C and 7D show the absorption spectra under TE and TM polarizations, respectively. The blue curves (bottommost curves) represent the absorption of a non-patterned solar cell with the same volume of active material. FIG. 7E shows that an average of the simulated enhancement curves displays a broadband enhancement.

FIGS. 10A-10C compare the performance of devices stamped with a flat- vs. a Blu-ray-patterned mold. FIG. 10A shows atomic force microscopy images of the active layer after stamping with a flat stamp (left) and without stamping (right). The horizontal line profiles in FIG. 10A are plotted in FIG. 10B, showing little difference between the flat- and non-patterned active layers. FIG. 10C shows characteristic current-density vs. voltage plots for flat-stamped and Blu-ray stamped PTB7:$PC_{71}BM$ solar cells.

FIGS. 11A-11I demonstrate optical disc nanopattern manipulation. FIG. 11A shows a typical compression and error-control algorithm for optical media discs, in which raw media data are compressed to reduce the file size and minimize data redundancy. Before writing to the disc the data are controlled for sequences that could result in read-errors, narrowing the allowable feature size range when written to the disc. FIG. 11B (top) shows a simulated projection image of a rewritable/blank optical disc, where white pixels represent the raised tracks and black pixels represent lowered rows. FIG. 11B (bottom) shows a map which represents the Fourier transform (FT) of the top simulated projection image, showing the first- and second-order diffraction peaks due to the periodic nature of the tracks. As shown in FIG. 11C (top), a pre-written optical media disc has distinct pits and lands, while its FT (bottom) shows pronounced scatter due to the quasi-random nature of the data. By overlaying multiple patterns (as shown in FIG. 11D), it is possible to reduce the polarization-dependence of the FT, as shown in FIG. 11E. Tuning the sizes of the features written to the disc (FIG. 11F) narrows the Fourier response, allowing for the creation of a discrete ring when applying the overlay technique from FIG. 11D, as shown in FIG. 11G. By tuning the track spacing (FIG. 11H), the first order diffraction peaks can be shifted, smeared out, or even eliminated. As shown in FIG. 11I, by increasing the track spacing to equal the mean length of the feature sizes, it is possible to overlay the ring with the first order diffraction peaks. The scale bars next to FIG. 11B show the length scales corresponding to the three most commonly used types of optical discs.

FIG. 12 illustrates how multiple parametric equations may be used to write overlapping data onto an optical media disc in order to provide stacked optical data storage formats such as those shown in FIGS. 11G and 11I.

DETAILED DESCRIPTION

Figure 1A:
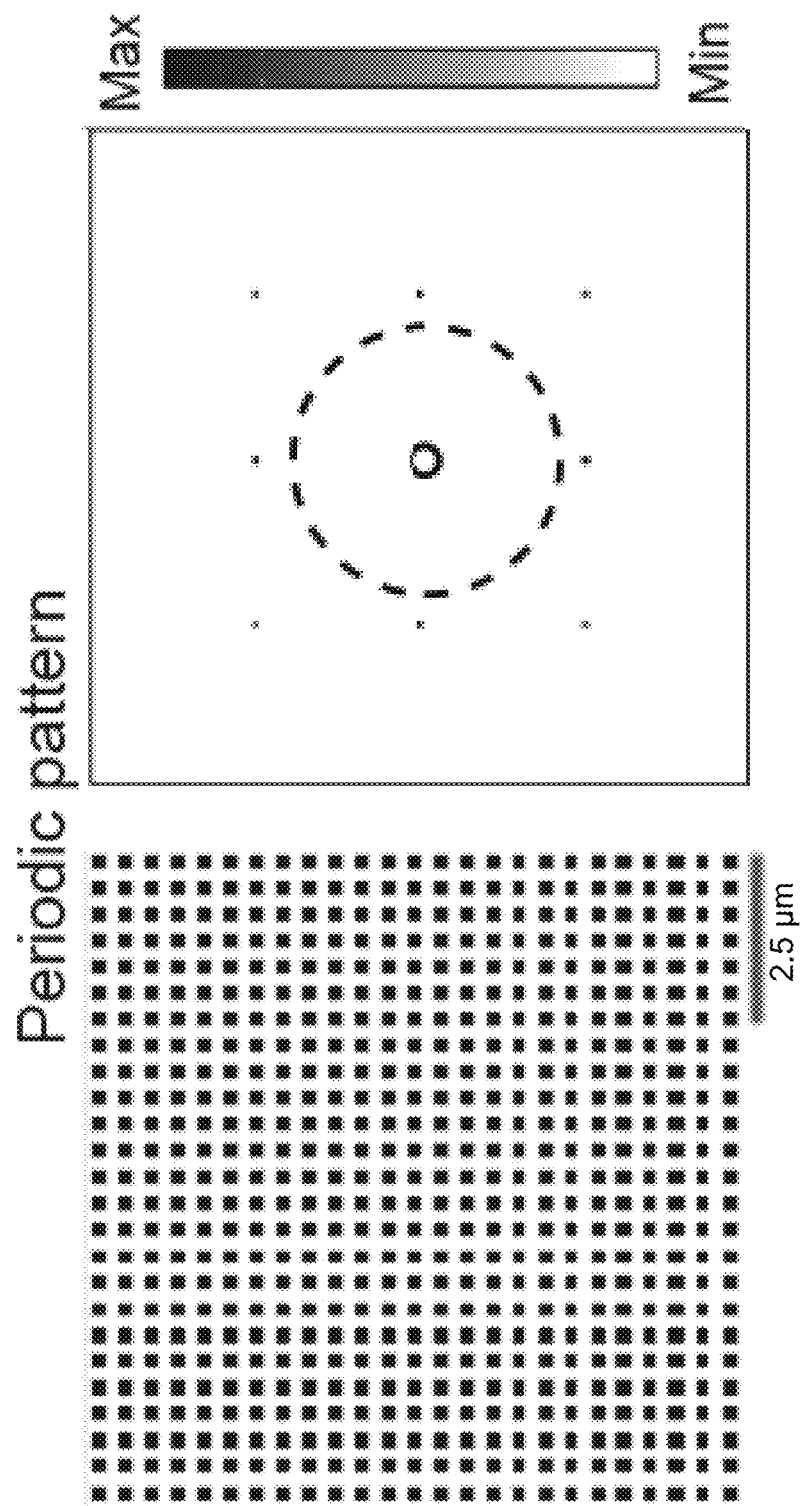
FIGS. 1A-1D depict the Fourier transformations of sub-wavelength features arranged in periodic, random, quasi-random and Blu-ray patterns. Images on the left are real space images and images on the right are Fourier-space images. Scale bar, 2.5 µm. See FIG. 1D for axes labels. The circles in the images on the right denote the largest (outer circles) and smallest (inner circles) k-values needed to couple the entire solar spectrum (315 nm to 2.5 µm) to surface plasmons at the interface between an example photoactive layer, PTB7:PC$_{71}$BM, and silver electrode.
Figure 1B:
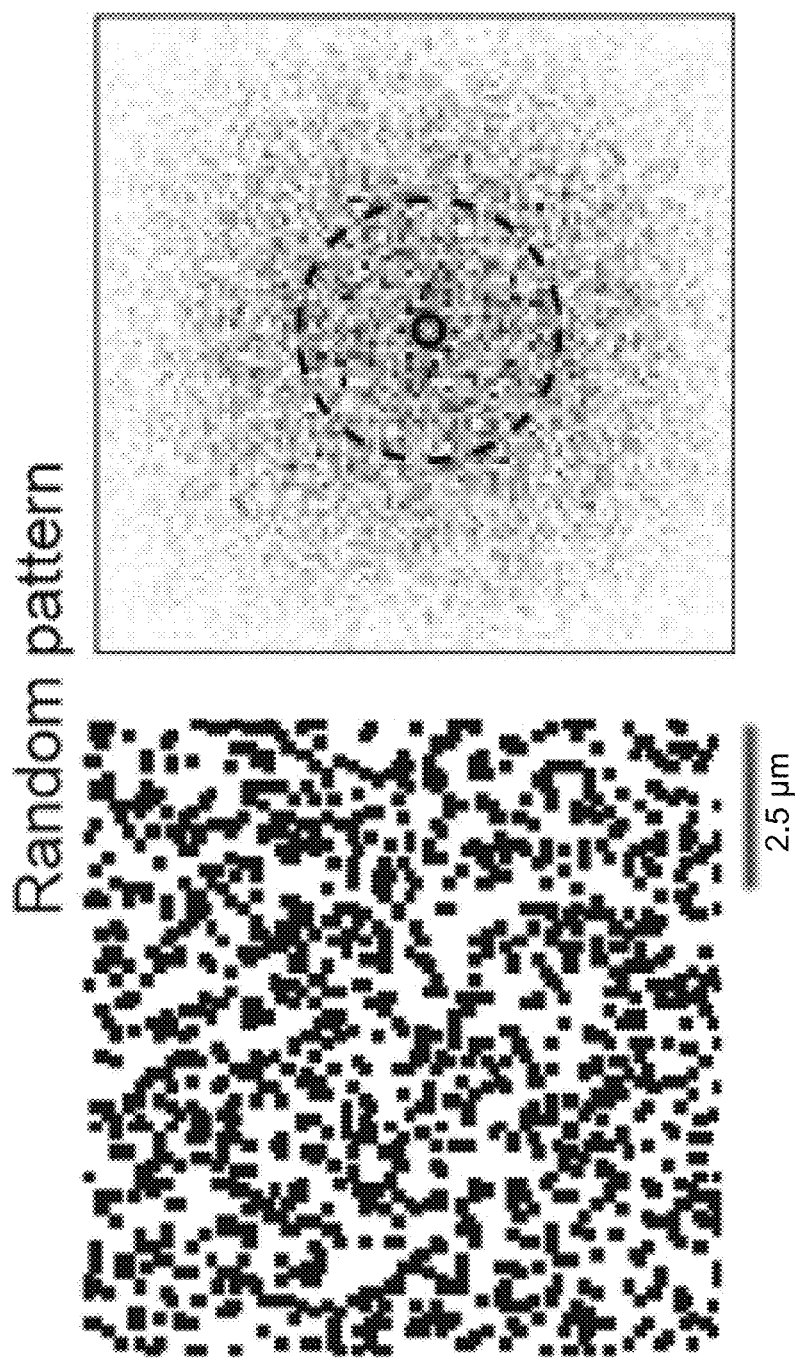

Provided are methods of patterning a layer of a photonic device using stamps derived from optical media discs. The stamps, the photonic devices comprising the patterned layer, and related methods are also provided.

In a basic embodiment, a method of patterning a layer of a photonic device comprises pressing a stamp on a surface of a layer of a photonic device, the stamp comprising a stamping surface which defines a negative replica of a quasi-random pattern of nanostructures defined in a recording layer of a pre-written optical media disc. The stamp is pressed for a period of time sufficient to imprint the quasi-random pattern of nanostructures defined in the recording layer of the pre-written optical media disc onto the surface of the layer of the photonic device. The method further comprises removing the stamp. By using this method, the surface of the layer of the photonic device has a quasi-random pattern of nanostructures defined therein which substantially matches the quasi-random pattern of nanostructures defined in the recording layer of the pre-written optical media disc.

The method makes use of stamps derived from pre-written optical media discs in order to imprint the patterns contained within such pre-written optical media discs onto layer(s) of photonic devices. Since pre-written optical media discs are mass produced at extremely low cost, the present methods offer a significantly lower cost, higher throughput and scalable alternative to patterning layers using molds made via advanced lithographic techniques (e.g., photolithography, electron beam lithography, focused ion beams, etc.) Moreover, since the quasi-random patterns defined in the recording layer of an optical media disc may be manipulated by adjusting the algorithms for writing data to the optical media disc, the present methods offer an efficient and cost-effective way to tune the quasi-random patterns to achieve a desired effect for a particular application (e.g., maximizing light trapping over a range of wavelengths, e.g., in order to enhance the efficiency of a photovoltaic cell).

Optical media discs are electronic storage media that can be written to and read from using a laser beam. Optical media discs are capable of encoding data in the form of nanometer-sized pits and lands formed on the surface of the recording layers of the optical media discs. The stamps used in the present methods are derived from pre-written optical media discs, by which it is meant optical media discs which have been written to such that the recording layers have been encoded with certain data (e.g., audio and visual data from a movie). Pre-written optical media discs may be referred to as "read-only" optical media discs. Pre-written optical media discs are distinguished from blank, rewritable, or write-once optical media discs.

Pre-written optical media discs comprise a recording layer, a surface of which defines a quasi-random pattern of nanostructures, the nanostructures comprising a plurality of pits and lands, generally arranged as a continuous spiral track extending from an innermost track near the center of the disc to an outermost track near the outer edge of the disc. A pre-written optical media disc may be characterized by its optical data storage format which further specifies a particular configuration for the plurality of pits and lands making up the quasi-random pattern of nanostructures. By way of illustration, the configuration, and thus the optical data storage format may be characterized by a pit width of the pits; a minimum pit length of the pits; and a track pitch. The pit width is the dimension across a pit along the read direction (y) of the optical media disc. The pit length is the dimension across a pit along the radial direction (x) of the optical media disc. The track pitch is the dimension from the center of a track of pits/lands to the center of an adjacent track of pits/lands.

The optical data storage format of the pre-written optical media disc may be a standard format characterized a particular pit width, a particular minimum pit length, and a particular track pitch. By way of illustration, the Table below lists four standard optical data storage formats.

TABLE

Standard Optical Data Storage Formats.

| Optical Data Storage Format | Pit width | Minimum pit length | Track Pitch |
| --- | --- | --- | --- |
| Compact Disc (CD) | 600 nm | 800 nm | 1.6 µm |
| Digital Versatile Disc (DVD) | 320 nm | 400 nm | 740 nm |
| High Density (HD) DVD | 200 nm | 200 nm | 400 nm |
| Blu-Ray Disc (BRD) | 130 nm | 150 nm | 320 nm |

Figure 4C:
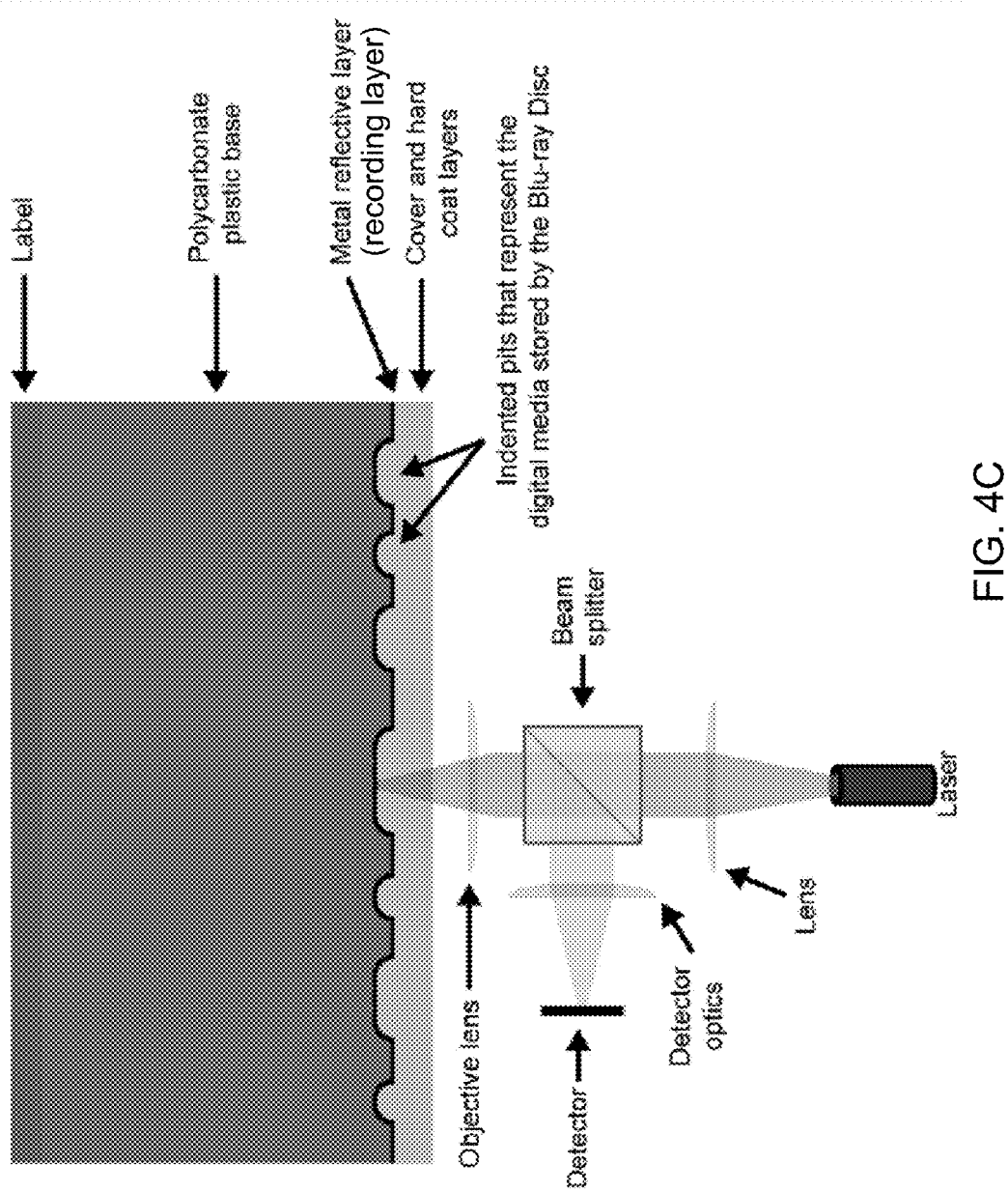
Figure 5A:
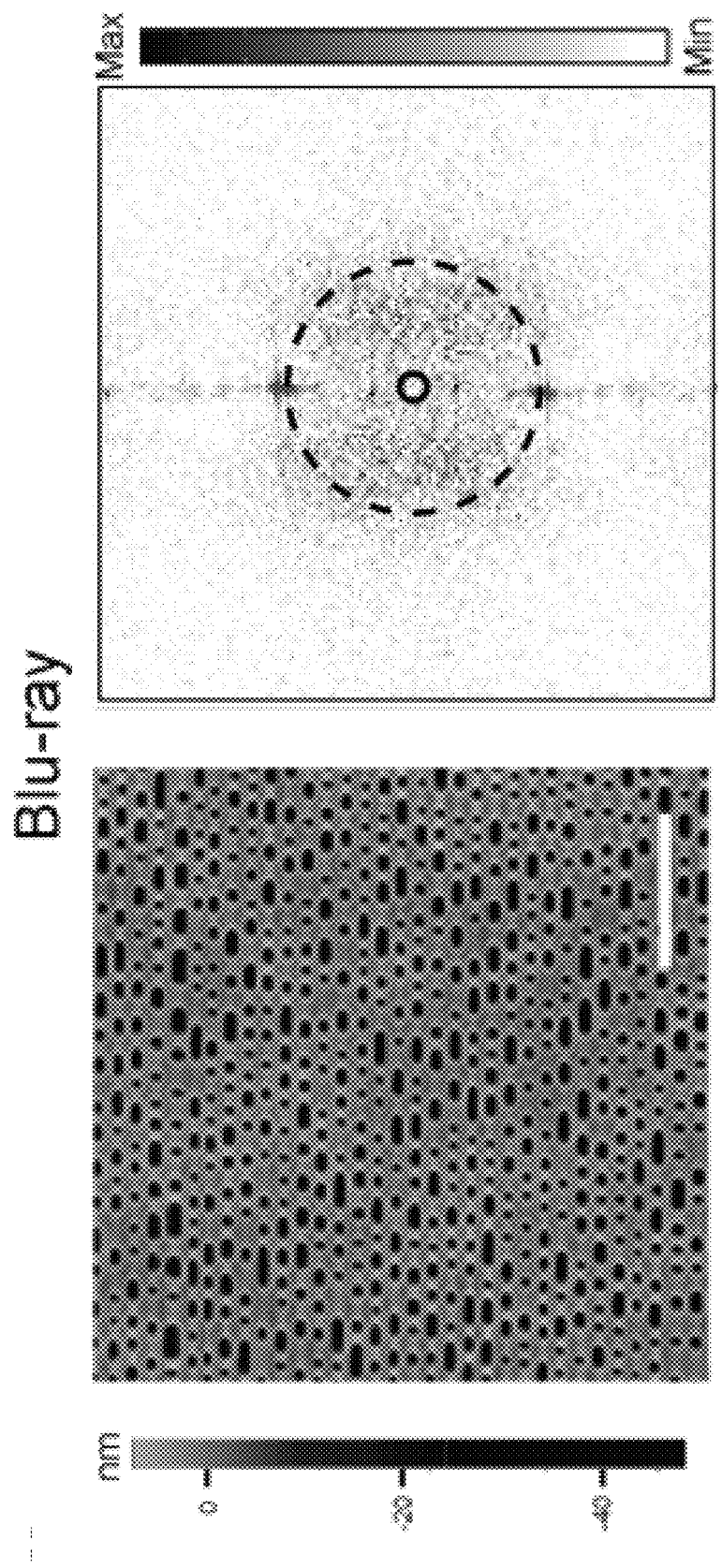
FIGS. 5A-5C show the feature sizes of optical media discs. The AFM images and Fourier transformation are shown for Blu-ray (FIG. 5A), DVD (FIG. 5B), and CD (FIG. 5C) discs. See FIG. 5C for axes labels. The Fourier transformation was conducted on 10 µm cell size corresponding to the AFM images. The outer and inner circles represent the largest and smallest wave vectors needed to couple visible spectrum (315 nm to 2 µm) to surface plasmon existing at the interface between PTB7:$PC_{71}BM$ and silver.
Figure 5B:
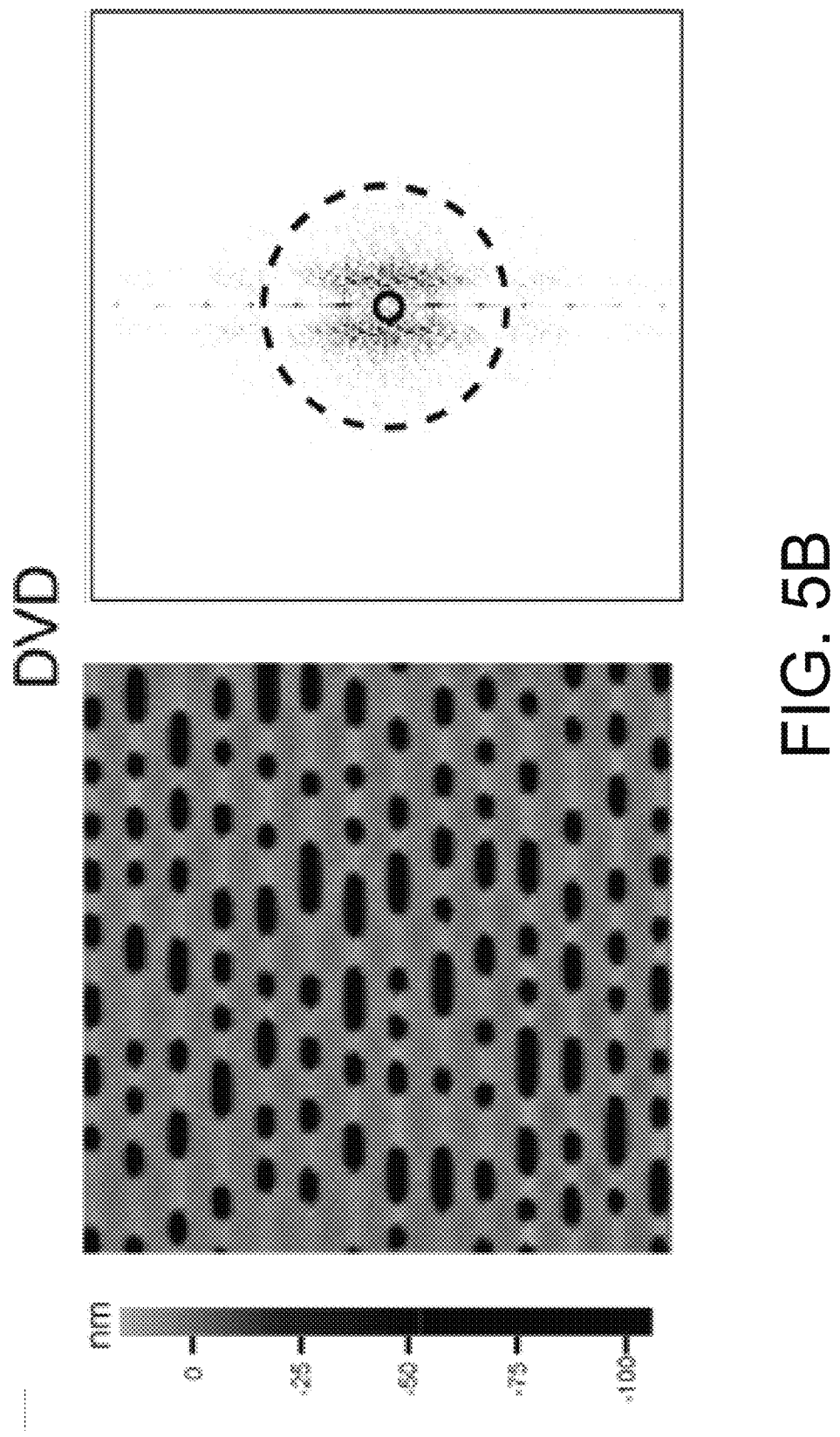
Figure 5C:
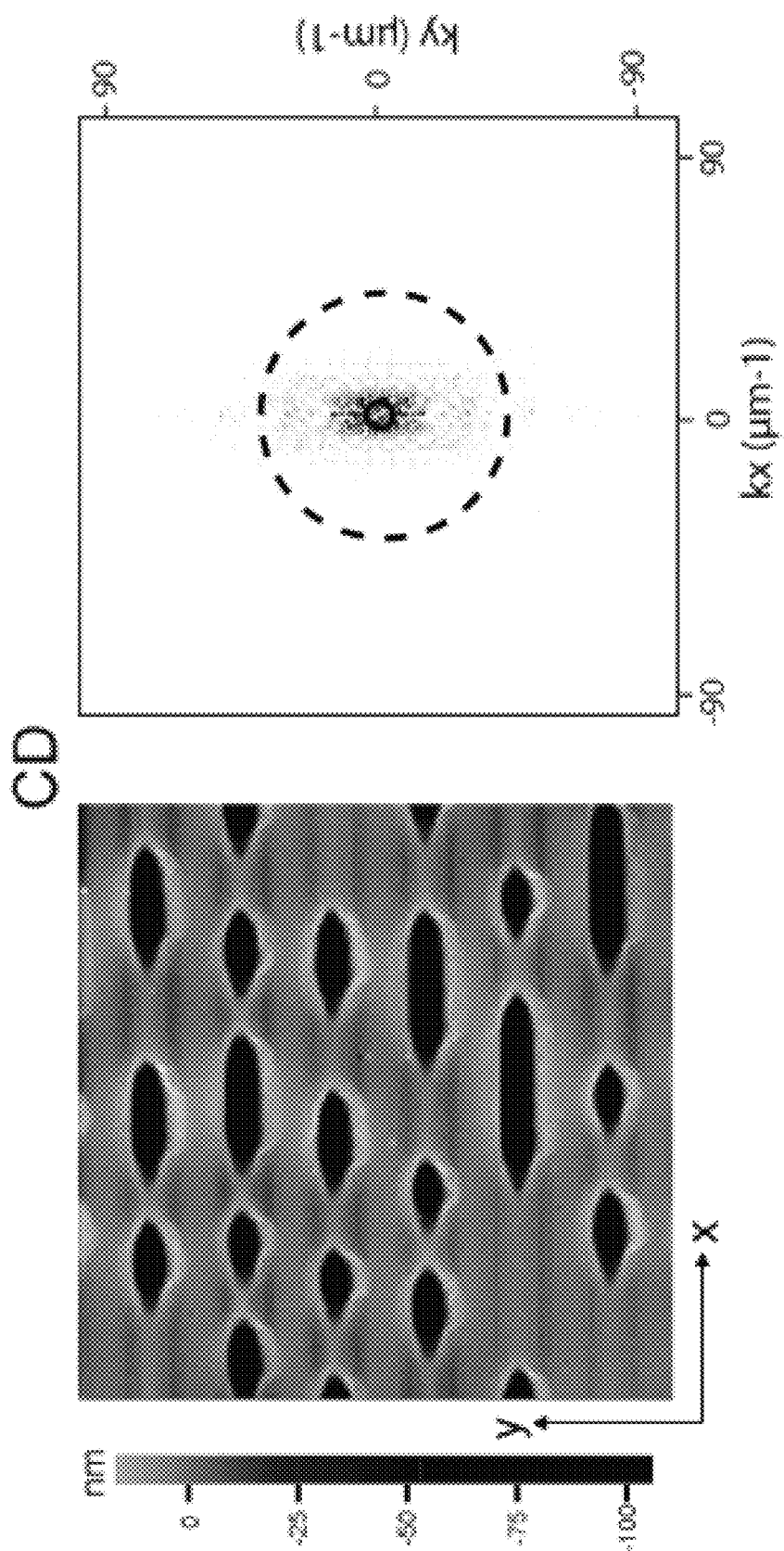

An AFM image of a section of the recording layer of a pre-written Blu-ray optical media disc is shown in FIG. 4A. A cross-sectional view of a schematic of the pre-written Blu-ray optical media disc is shown in FIG. 4C. These figures show that the surface of the recording layer of the optical media disc has defined therein a quasi-random pattern of nanostructures, the nanostructures comprising a plurality of pits and lands arranged in a plurality of tracks. The tracks of the plurality of tracks are aligned along their longitudinal axes. The quasi-random pattern of nanostructures is configured according to the Blu-ray optical data storage format (i.e., an optical data storage format characterized by a pit width of 130 nm, a minimum pit length of 150 nm, and a track pitch of 320 nm).

The optical data storage format of the pre-written optical media disc may be a non-standard optical data storage format specifying particular pit dimensions, land dimensions and/or track pitches which deviate from the values characterizing a standard optical data storage format. Such deviations may be used to tune the Fourier response of the quasi-random pattern of nanostructures to achieve a particular effect on the light manipulated by the patterned layer. By way of illustration, a non-standard optical data storage format may be obtained by restricting the length of a pit and/or the length of a land to be within a particular range of values. As another illustration, a non-standard optical data storage format may be obtained by altering (i.e., increasing or decreasing or eliminating) the track pitch. As another illustration, a non-standard optical data storage format may be obtained by modulating the track pitch, i.e., allowing the track pitch to be within a particular range of values, thereby introducing randomness into the track pitch. Combinations of these modifications may be used to provide the non-standard optical data storage format.

Figure 11D:
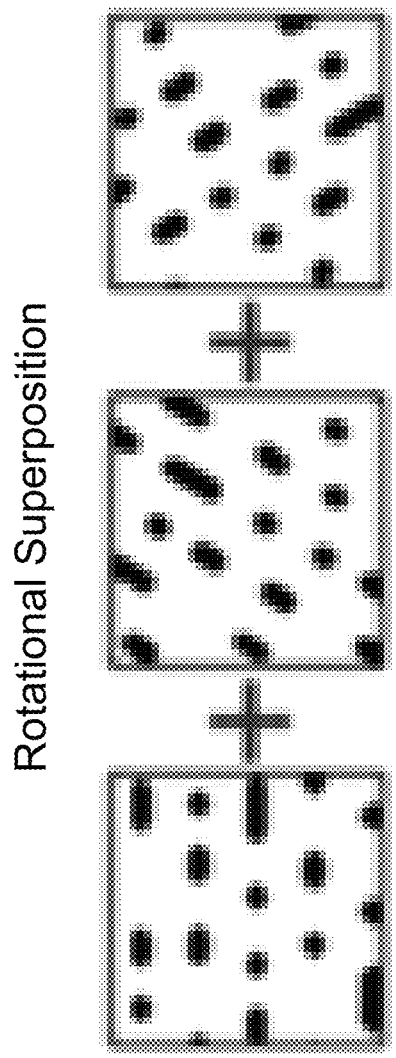

Illustrative non-standard optical data storage formats are described in Example 2, below. In particular, the quasi-random patterns of nanostructures schematically illustrated in FIGS. 11F and 11H include those configured according to a non-standard optical data storage format. The quasi-random patterns themselves are shown in the top images (real space images) and the Fourier response of the quasi-random patterns are shown in the bottom images (Fourier space images). FIG. 11F demonstrates the effect of the contiguous length of pits and lands on the Fourier transform of the quasi-random pattern. In the left-most image of FIG. 11F, 2 or 3 contiguous bits forming pits and lands is shown; in the adjacent image, 4 or 5 contiguous bits forming pits and lands is shown; in the next adjacent image 6 or 7 contiguous bits forming pits and lands is shown; in the right-most image 8, 9, 10 . . . 20 contiguous bits forming pits and lands is shown. FIG. 11F is further discussed in Example 2, below.

Figure 11E:
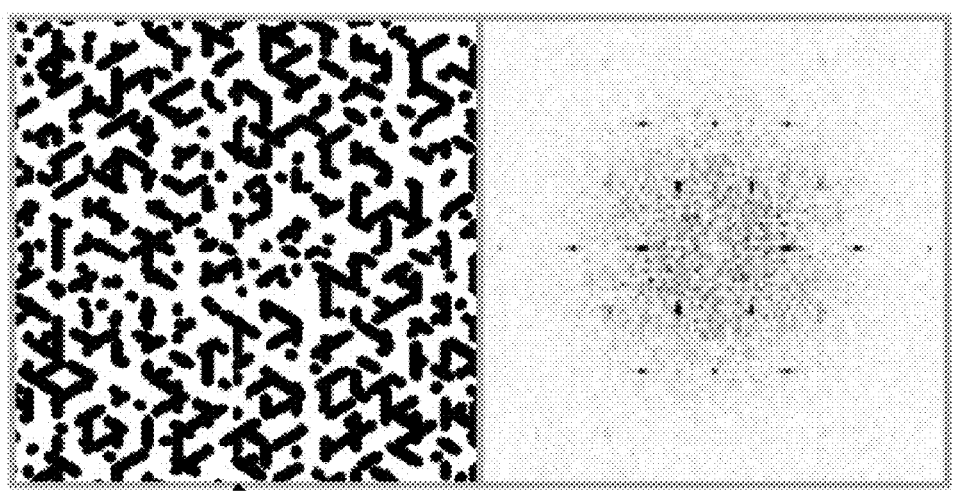
Figure 11F:
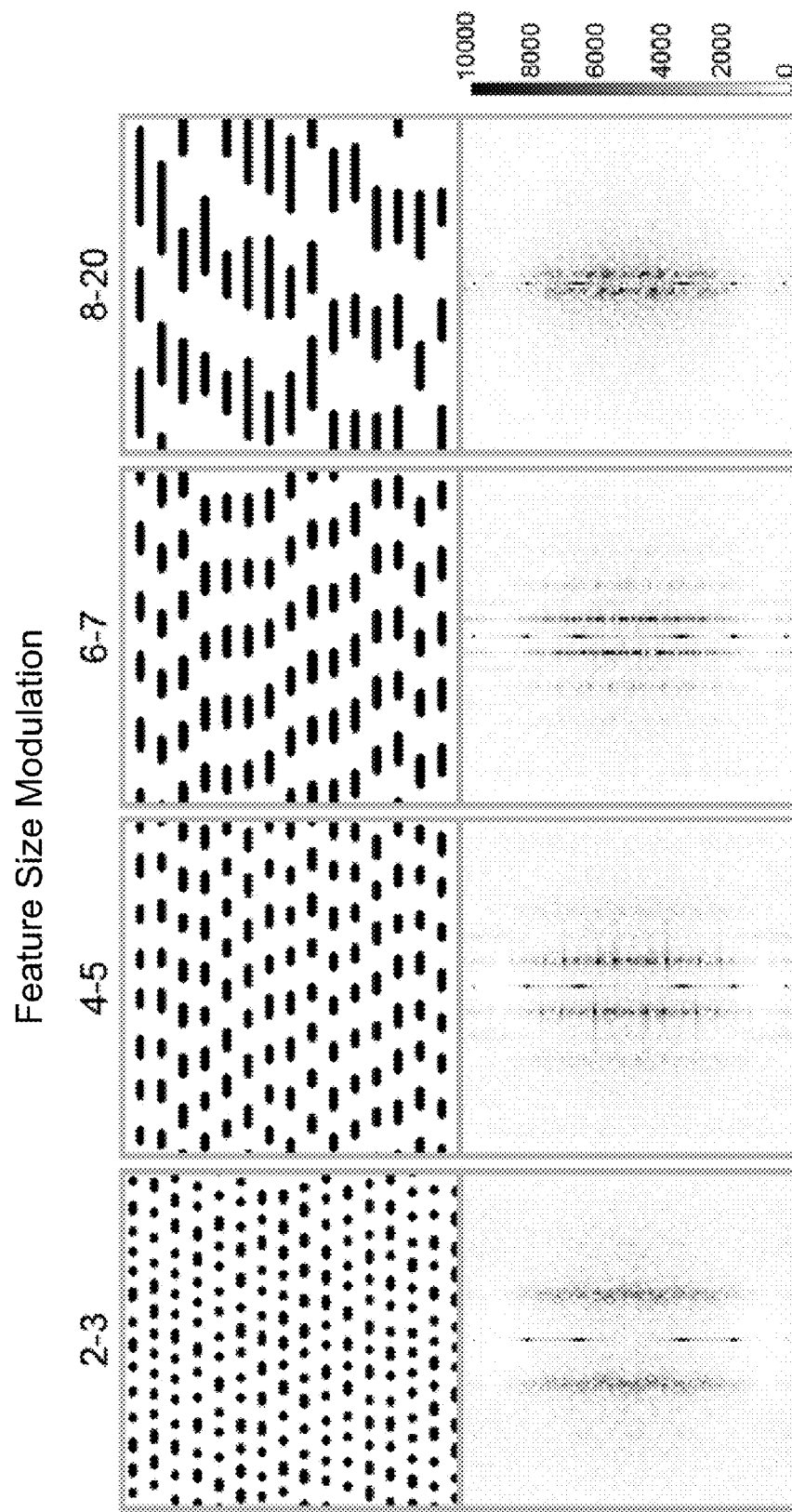
Figure 11G:
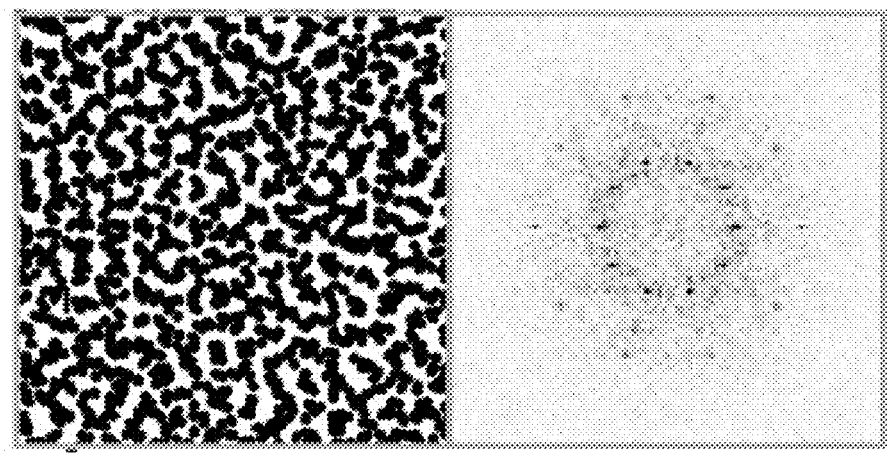
Figure 11H:
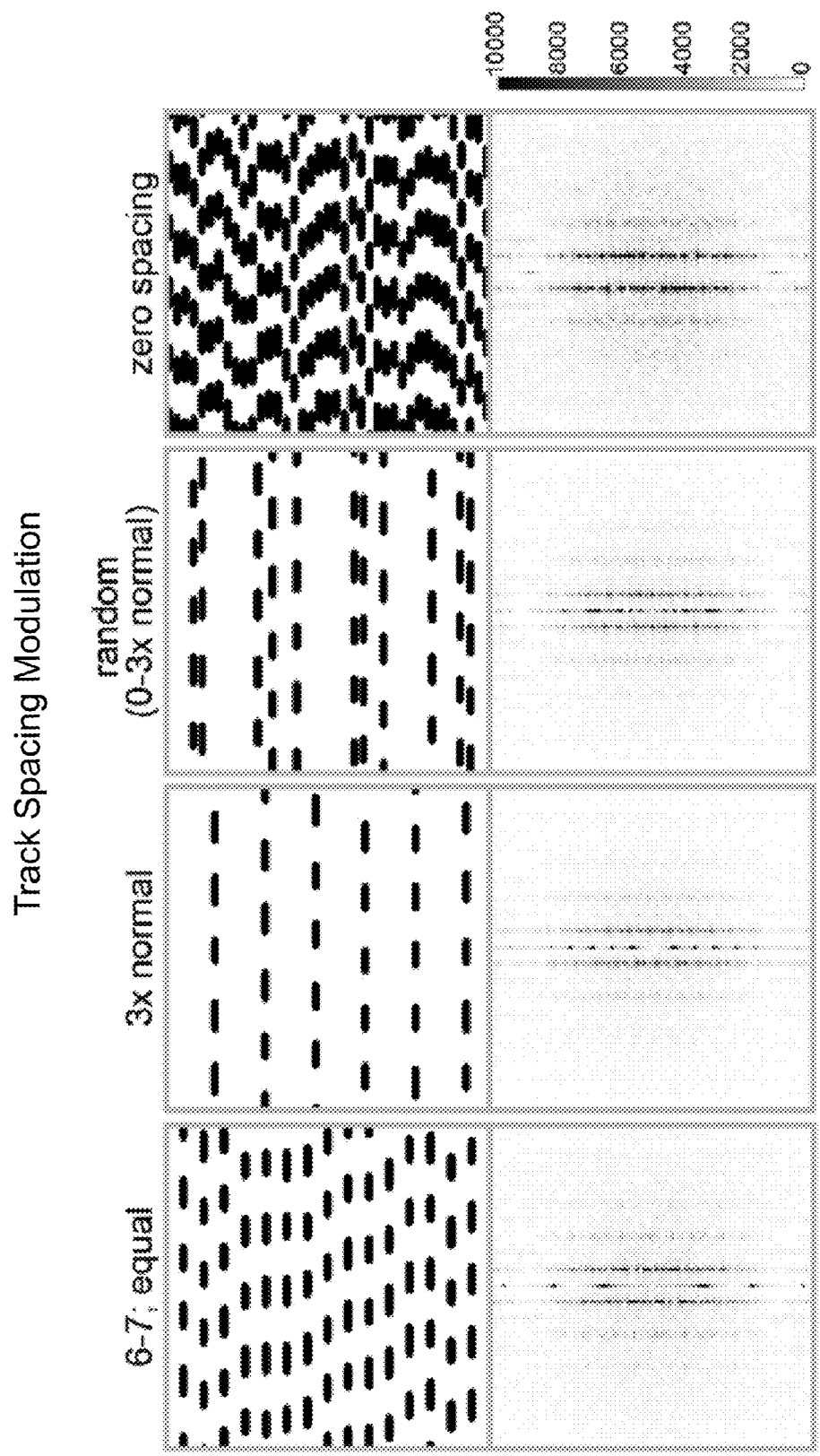

FIG. 11H demonstrates the effect of track spacing on the diffraction peaks of the Fourier transform of the quasi-random pattern. Each of the images of FIG. 11H makes use of 6 or 7 contiguous bits forming pits and lands. In the left-most image of FIG. 11H, the track spacing (i.e., pitch) is that dictated by a standard optical data storage format; in the adjacent image, the track spacing is increased by a factor of three as compared to the standard optical data storage format; in the next, adjacent image, the track spacing is allowed to vary randomly between from 0 to three times greater than that of the standard optical data storage format; in the right-most image, the track spacing is eliminated (i.e., there is no spacing between tracks). FIG. 11H is further discussed in Example 2, below. Non-standard optical data storage formats may be obtained by modifying the algorithms (which already account for a particular pit/land dimension and track pitch) used to write to optical media discs.

The optical data storage format of the pre-written optical media disc may be a stacked optical data storage format in which standard optical data storage formats, non-standard optical data storage formats, or combinations thereof, are stacked or overlaid. As described above, each standard and/or non-standard optical data storage format within the stack further specifies a particular configuration for the plurality of pits and lands making up the quasi-random pattern of nanostructures. Thus, a quasi-random pattern of nanostructures configured according to a stacked optical data storage format will be a stacked pattern comprising a quasi-random pattern of nanostructures overlaid with one or more additional quasi-random patterns of nanostructures.

By way of illustration, the top image of FIG. 11E represents a stacked quasi-random pattern of nanostructures configured according to a stacked optical data storage format (the bottom image is the corresponding Fourier response). The stacked quasi-random pattern of nanostructures includes a first quasi-random pattern of nanostructures configured according to a standard Blu-ray optical data storage format (left image of FIG. 11D) overlaid with a second quasi-random pattern of nanostructures configured according to a Blu-ray optical data storage format in which the tracks have been oriented 60° relative to the standard Blu-ray optical data storage format (middle image of FIG. 11D) overlaid with a third quasi-random pattern of nanostructures configured according to a Blu-ray optical data storage format in which the tracks have been oriented 120° relative to the standard Blu-ray optical data storage format (right image of FIG. 11D). Each quasi-random pattern of nanostructures comprises a plurality of pits and lands arranged in a plurality of tracks, the tracks aligned along their longitudinal axes. The angle $\theta_1$ defined by the longitudinal axes of the tracks in the second quasi-random pattern of nanostructures relative to the longitudinal axes of the tracks in the first quasi-random pattern of nanostructures is about 60°. The angle $\theta_2$ defined by the longitudinal axes of the tracks in the third quasi-random pattern of nanostructures relative to the longitudinal axes of the tracks in the first quasi-random pattern of nanostructures is about 120°. However, these values for the angles $\theta_1$ and $\theta_2$ are not limiting. Other angles may be used, e.g., angles in the range of greater than 0° to less than 360°, e.g., angles of 5°, 10°, 20°, 30°, etc. Similarly the number of overlaid quasi-random pattern of nanostructures is not limiting.

The top image of FIG. 11G also illustrates a stacked quasi-random pattern of nanostructures configured according to a stacked optical data storage format (the bottom image is the corresponding Fourier response). In particular, the stacked quasi-random pattern of nanostructures includes the quasi-random pattern of nanostructures shown in the left-most image of FIG. 11F overlaid three times, in three different orientations.

Figure 11I:
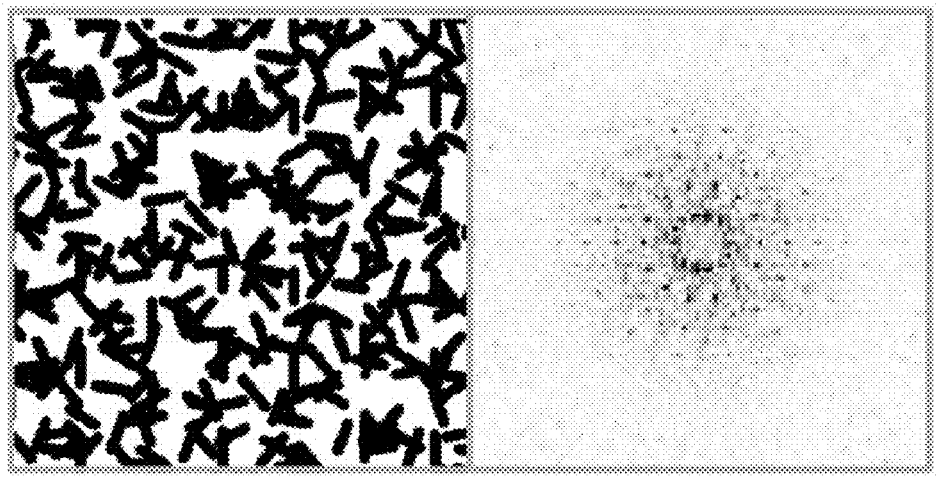

The top image of FIG. 11I also illustrates a stacked quasi-random pattern of nanostructures configured according to a stacked optical data storage format (the bottom image is the corresponding Fourier response). In particular, the stacked quasi-random pattern of nanostructures includes the quasi-random pattern of nanostructures shown in the second from the left image of FIG. 11H overlaid five times, in five different orientations.

Figure 1C:
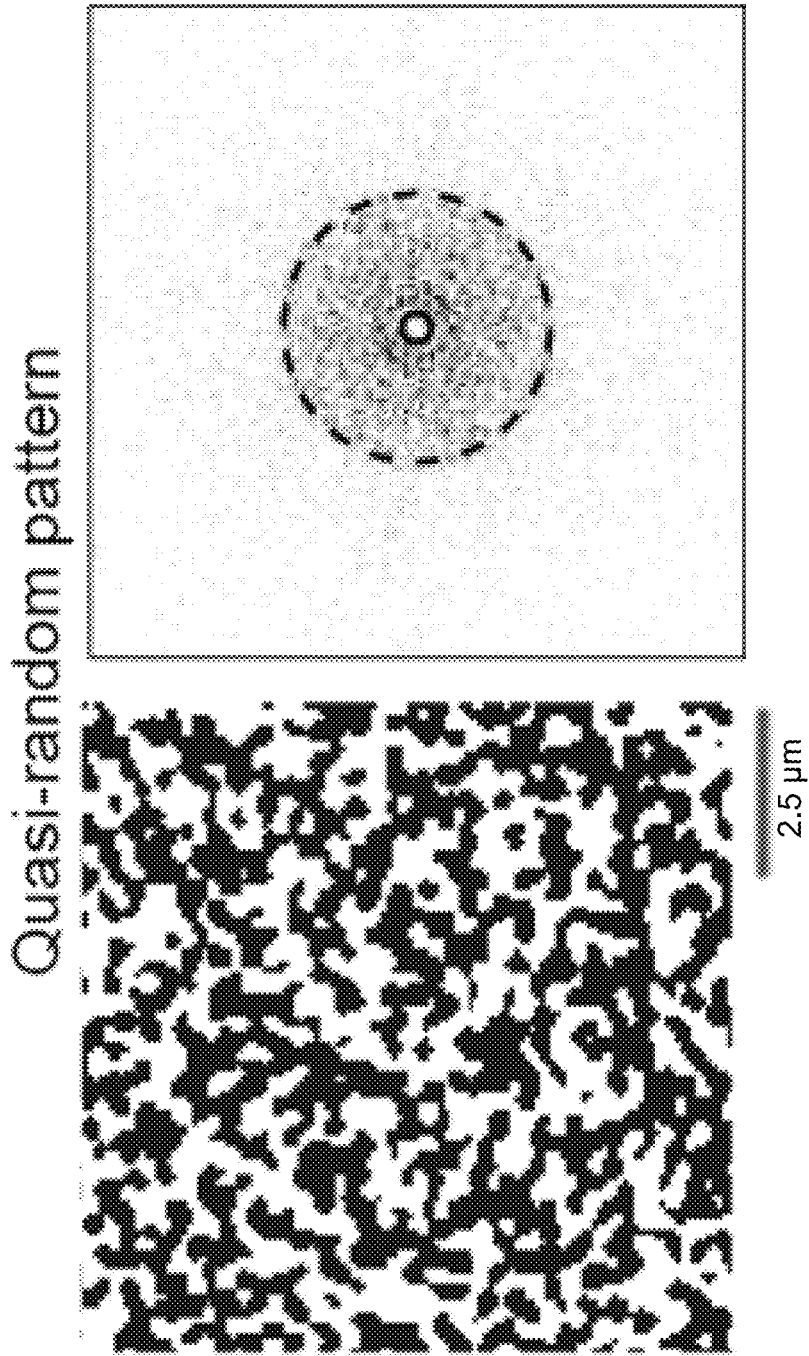
Figure 1D:
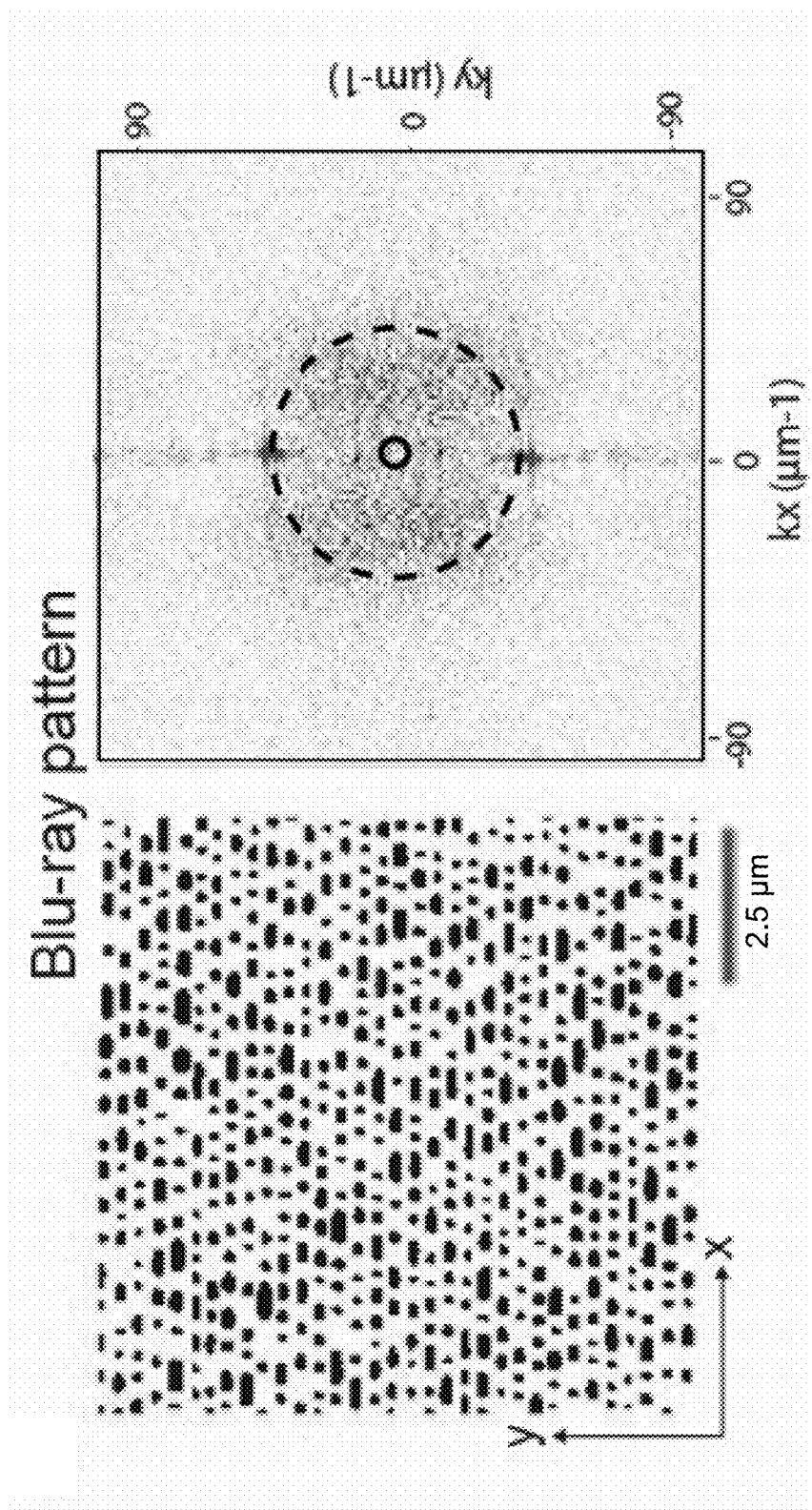

The number of optical data storage formats and the type of optical data storage formats to be stacked may be selected to provide a particular Fourier response for the stacked quasi-random pattern of nanostructures. By way of illustration, the stacked quasi-random pattern of nanostructures may be configured to provide a ring in Fourier space having a size which corresponds to a desired range of photon energies and/or to provide a desired placement of the diffraction peaks. The stacked quasi-random pattern of nanostructures may be configured to provide a Fourier response which is characterized by a distribution of k-values which is substantially within the k-values required to couple light having a selected range of wavelengths (e.g., from about 315 nm to about 2.5 mm, from about 315 nm to about 775 nm, etc.) to surface plasmons existing at the interface between the patterned layer and an overlying layer. (See the right image in FIG. 1C for an optimal distribution of k-values which is substantially within the k-values required to couple light having a range of wavelengths covering the entire solar spectrum.)

By using multiple parametric equations, such as the ones shown in FIG. 12, to dictate the rotation speed (t) vs. the radial position (r1 or r2) of the raster head on which the laser is mounted, it is possible to write overlapping data onto an optical media disc. Thus, the stacked optical data storage formats described above and those illustrated in FIGS. 11G and 11I may be obtained using the same raster scan technology currently used to manufacture optical media discs in the industry.

Figure 2A:
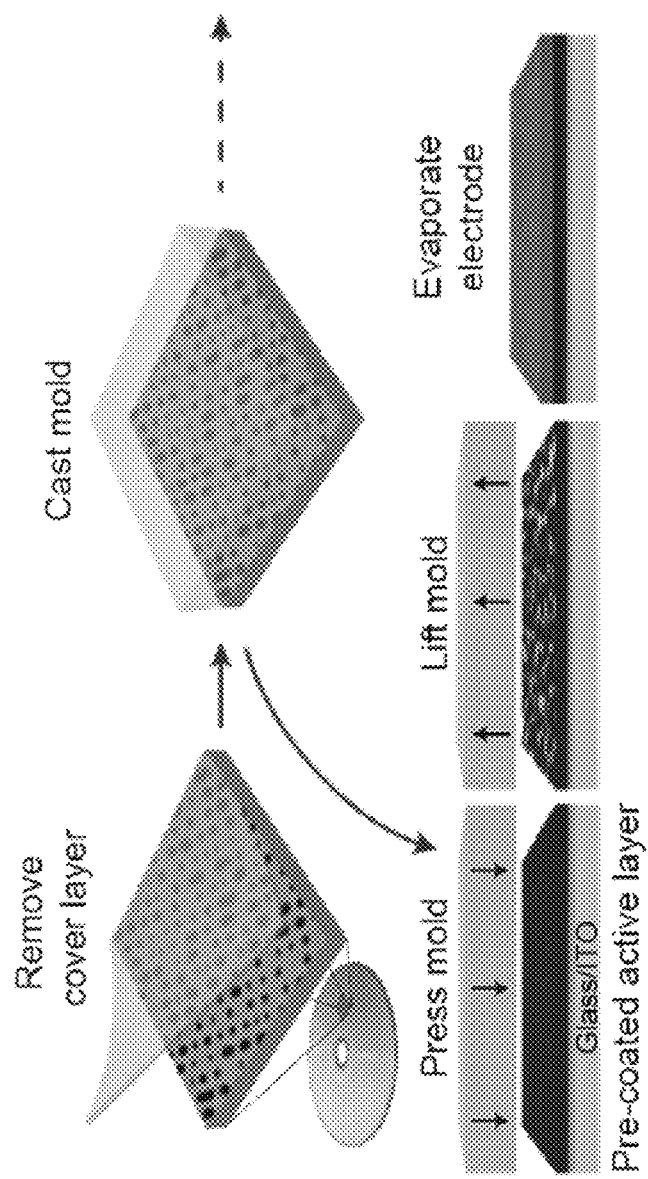
FIGS. 2A-2C depict the processing of Blu-ray patterned solar cells.
Figure 2B:
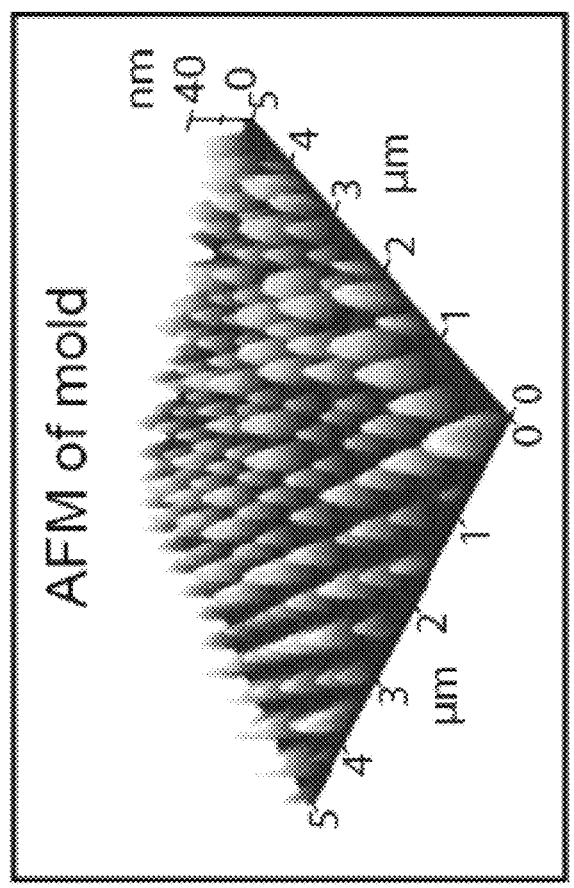

The stamps used in the present methods comprise a stamping surface, which is the surface of the stamp to be pressed onto the surface of the layer of the photonic device to be patterned. Thus, the stamping surface defines a negative replica of the quasi-random pattern of nanostructures to be defined in the surface of the layer to be patterned. The stamps are derived from the pre-written optical media discs themselves. As illustrated in FIG. 2A and further described in Example 1, below, a stamp may be made by using the pre-written optical media disc as a template. In particular, a material may be cast onto an exposed surface of the recording layer from a section of the pre-written optical media disc and subsequently lifted off. Prior to lift off, the cast material may be cured for a period of time at an elevated temperature sufficient to harden the cast material. A variety of materials may be used for the stamp, e.g., a polymeric material such as polydimethylsiloxane (PDMS).

Alternatively, the stamp may be a material layer of the pre-written optical media disc. As illustrated in FIG. 4C, a cross-sectional view of a schematic of a pre-written optical media disc characterized by the Blu-ray optical data storage format is shown. The layer below the recording layer (i.e., the cover and hard coat layers) may be used as the stamp.

In both embodiments, the stamp comprises a stamping surface which defines a negative replica of the quasi-random pattern of nanostructures defined in the recording layer of the pre-written optical media disc. This quasi-random pattern of nanostructures defined in the recording layer of the pre-written optical media disc may be configured according to any of the standard, non-standard, or stacked optical data storage formats described above.

The stamping surface may be modified prior to use in patterning the layer of the photonic device. By way of illustration, the pits on the stamping surface may be etched so that they are sufficiently deep to accommodate a desired thickness for the layer to be patterned.

The layer to be patterned by the present methods is a layer of a photonic device. By photonic device, it is meant a device comprising a photoactive layer capable of generating, manipulating or detecting light within the device. Illustrative photonic devices include photovoltaic cells, photonic couplers, etc. However, the term "photonic device" as used herein excludes optical media discs.

The composition of the layer to be patterned depends upon the particular photonic device and the particular portion of the photonic device to include the pattern. In some embodiments, the photonic device is a photovoltaic cell. The photovoltaic cell may comprise a front electrode layer, a back electrode layer, a photoactive layer between the front and back electrode layers, and an electron transport layer between the front and back electrode layers. Any of these layers may be patterned by the present methods. Photoactive layers composed of a variety of materials may be used, e.g., organic materials such as PTB7:$PC_{70}$BM, P3HT:PCBM, etc.; or inorganic materials such as silicon, perovskites, group III-V semiconductors, group II-VI semiconductors, etc. Electrode layers composed of a variety of materials may be used, e.g., Al, Ag, Au, etc. The present methods may comprise additional steps related to forming the additional layers over the patterned layer in order to complete the photonic device.

As described above, a layer of a photonic device may be patterned with a stacked quasi-random pattern of nanostructures which comprises a quasi-random pattern of nanostructures overlaid with one or more additional quasi-random pattern of nanostructures. Such stacked quasi-random patterns of nanostructures may be formed from a stamp derived from a pre-written optical media disc characterized by a stacked optical data storage format. In such an embodiment, the recording layer of the pre-written optical media disc defines a stacked quasi-random pattern of nanostructures configured according to the stacked optical data storage format and the stamping surface of the stamp defines a negative replica of the stacked quasi-random pattern of nanostructures.

Alternatively, a layer of a photonic device may be patterned with a stacked quasi-random pattern of nanostructures by pressing a single stamp derived from a pre-written optical media disc characterized by an "unstacked" optical data storage format (e.g., one of the standard or non-standard optical data storage formats described above) multiple times onto a surface of the layer. As another alternative, multiple stamps, each stamp derived from a pre-written optical media disc characterized by a different unstacked optical data storage format, may be individually pressed onto the surface of the layer. In these embodiments, the type of stamps, the number of presses, the relative orientation of the presses, and/or the number of stamps may be selected to provide a desired stacked quasi-random pattern of nanostructures.

By way of illustration, a layer of a photonic device may be patterned with the stacked quasi-random pattern of nanostructures shown in FIG. 11E (top) by: first, pressing a stamp derived from a pre-written optical media disc template characterized by the Blu-ray optical data storage format in a first orientation onto the surface of the layer (see the left image of FIG. 11D); second, pressing the stamp onto the surface of the layer in a second orientation (e.g., 60°) relative to the first orientation (see the middle image of FIG. 11D); and third, pressing the stamp onto the surface of the layer in a third orientation (e.g., 120°) relative to the first orientation (see the right image of FIG. 11D). The stacked quasi-random pattern of nanostructures shown in FIG. 11G (top) may be similarly made using a stamp derived from a pre-written optical media disc template characterized by the optical data storage format shown in the left-most image of FIG. 11F and pressing the stamp three times in three different orientations. The stacked quasi-random pattern of nanostructures shown in FIG. 11I (top) may be similarly made using a stamp derived from a pre-written optical media disc template characterized by the optical data storage format shown in the second from left image of FIG. 11H and pressing the stamp five times in five different orientations.

As another illustration, a layer of a photonic device may be patterned with a stacked quasi-random pattern of nanostructures by: first, pressing a first stamp derived from a first pre-written optical media disc template characterized by a first non-standard optical data storage format onto the surface of the layer; and second, pressing a second stamp derived from a second pre-written optical media disc template characterized by a second non-standard optical data storage format onto the surface of the layer. Additional stamps, e.g., a third stamp, a fourth stamp, etc. may be used.

The present methods of patterning layers of photonic devices may be extended to photolithography employing masks derived from pre-written optical media discs. In a basic embodiment, a method of patterning a layer of a photonic device comprises aligning a mask on a surface of a photoresist-coated layer of a photonic device, the mask comprising a masking surface which defines a negative replica of a quasi-random pattern of nanostructures defined in a recording layer of a pre-written optical media disc. The mask is then illuminated with light under conditions sufficient to expose the photoresist-coated layer according to the quasi-random pattern of nanostructures defined in the recording layer of the pre-written optical media disc. Following standard photolithographic techniques, the illuminated photoresist-coated layer is developed to remove portions of the photoresist coating to provide uncoated portions of the layer; the uncoated portions are etched; and any remaining photoresist coating is removed. By using this method, the surface of the layer of the photonic device has a quasi-random pattern of nanostructures defined therein which substantially matches the quasi-random pattern of nanostructures defined in the recording layer of the pre-written optical media disc.

In this embodiment, the description of the patterning method employing photolithographic masks follows that described above with respect to the patterning method employing stamps, with the exception of the method of making the masks. Masks may be made similarly to the casting technique used to form the stamps, except that the material(s) cast (or deposited, grown, etc.) onto the pre-written optical media disc templates are those appropriate for carrying out photolithography, e.g., a layer of metal underlying a layer of a transparent material.

In another embodiment, the "spikes" on the photolithographic masks made as described above may be used to pick up and remove photoresist from a photoresist-coated layer of a photonic device. This step may be repeated multiple times with rotation, leaving photoresist only in places where the pattern was not there (i.e., the white portions in the patterns of FIGS. 11E, 11G, 11I). A typical photolithography process could then be followed to provide the patterned layer.

The photolithographic masks and the photonic devices comprising the patterned layer(s) made using the photolithographic masks are also provided.

EXAMPLES

Example 1: Repurposing Blu-Ray Movie Discs as Low-Cost, Quasi-Random Nanoimprinting Templates for Photon Management Introduction This example reports the use of pre-written Blu-ray movie discs as nanoimprinting molds for introducing quasi-random nanostructures into organic solar cells to enhance their efficiencies. Blu-ray discs are mass-produced data storage media with very low costs. Regardless of the content, the audio and video compression algorithms convert the data into a high-entropy binary sequence before error-control coding and modulation, eventually yielding a quasi-random arrangement of subwavelength "pits" and "lands" on the disc. This pattern is surprisingly well suited for photon management over the solar spectrum. In this example, a Blu-ray pattern is successfully imprinted onto the active layer—and subsequently to the metal electrode—of polymer solar cells, leading to higher absorption and power conversion efficiencies. Additionally, the use of this technique for enhancing light trapping for other photoactive materials is demonstrated.

Methods

Fourier Transforms:

The two-dimensional discrete Fourier transform (DFT) of the images in FIGS. 1A-D (left images) were computed and the color-map customized to improve the contrast of the FT images so as to better compare the features.

Numerical Calculations:

The absorption was calculated by rigorous coupled wave analysis (RCWA), which is one of the most commonly used techniques to solve the scattering problem in Fourier space. For the multilayered dielectric stacks, Fourier expansions of both the field and the permittivity lead to an algebraic eigenvalue system for each layer. As quasi-randomness along one direction is of interest, a 1D simulation was implemented with periodicity 10 μm. The number of Fourier components considered was 289 and the convergence test was performed on the selection of the diffraction order to ensure the numerical accuracy.

Nanopatterned Mold Fabrication:

Polydimethylsiloxane (PDMS) nanopatterned molds were fabricated using a delaminated Blu-ray disc as the master. The Blu-ray movie disc (Supercop) was first trimmed around the edges using scissors, and then carefully peeled off the cover layer (see FIG. 2A) to reveal the pattern shown in FIG. 4A. No cleaning or secondary processing of the Blu-ray disc was required, as the cover layer effectively protects the nanopatterned surface after manufacturing. PDMS was cast on top of the delaminated Blu-ray disc, and then cured overnight at 60° C. After preparation, the PDMS mold could be lifted off the Blu-ray disc and reused several times. The cover layer, which was removed as shown in FIG. 2A, contains the same pattern as the PDMS mold and can also be used as a nanoimprinting stamp. However, PDMS stamps may more reliably transfer the 2D pattern to polymer thin films due to their flexibility, ductility, and favorable surface energy properties.

Figure 10C:
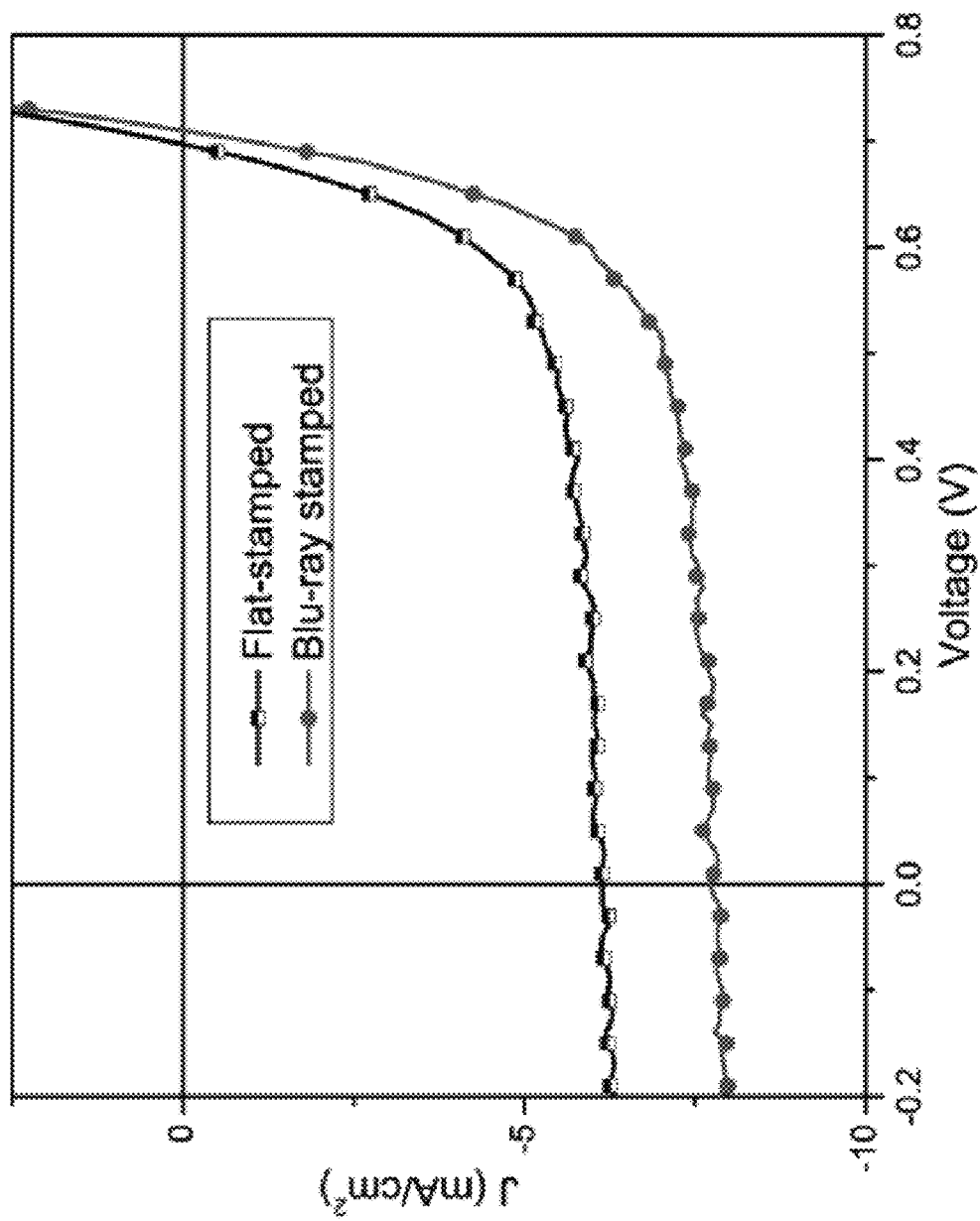

Device Fabrication:

FIG. 2A schematically shows the device fabrication procedure. All devices were fabricated on patterned ITO-coated glass substrates (20Ω sq$^{-1}$) that were pre-cleaned and treated with oxygen plasma immediately before use. A sol-gel synthesis was employed for the ZnO electron transport layer (ETL) following established procedures.[30] A solution of 0.25M zinc acetate dihydrate and 0.25M ethanolamine in 2-methoxyethanol was spin-coated through a PVDF filter and annealed at 180° C. for 20 minutes to yield a 15 nm thick film. The 15 nm thickness of the ZnO films was verified using spectroscopic ellipsometry (J. A. Woollam M2000U). The active material was prepared by blending poly-[[4,8-bis[(2-ethylhexyl)oxy]benzo[1,2-b:4,5-b']dithiophene-2,6-diyl]-[3-fluoro-2-[(2-ethylhexyl)carbonyl] thieno[3,4-b]thiophenediyl]] (PTB7; 1-material) with (6,6)-phenyl $C_{71}$-butyric acid methyl ester ($PC_{71}BM$; nano-C) at 1.0:1.5 in a solution of 97 vol % chlorobezene (Sigma) and 3 vol % diodooctane (Sigma) and mixed for two days at 65° C. A solution concentration of 10 mg mL$^{-1}$ by total weight yielded an active layer thickness of 50 nm. After spin-coating, a PDMS stamp was placed on top of the active layer (for stamped devices) and all devices were placed under vacuum for 2 hours in order to allow for evaporation of the diodooctane, and for PTB7 and $PC_{71}BM$ domains to phase segregate. If the stamp was removed immediately, the nanopattern would fade away within a few hours, which was attributed to the residual solvent allowing the active material to reconfigure into a lower energy (i.e. flatter) morphology. After carefully removing the stamp, all devices were moved to a thermal evaporator (Angstrom Covap II), where 10 nm of $MoO_3$ (Alfa Aesar, Puratronic, 99.9995%) and 100 nm of Ag were deposited. Control experiments were conducted with devices stamped with a flat PDMS mold. The physical morphologies of the flat-stamped control and non-stamped active layers are comparable (See FIG. 10A), with the flat-stamped device being slightly smoother.

Characterization of Photovoltaic Cells:

Microscopic and morphological characterization was performed using an SEM (FEI Nova 600) or AFM (Park Systems XE-100), respectively. Reflection data was obtained with an Andor SR-303i_A spectrometer combined with Leica DMI 3000M microscope (10× objective, numerical aperture NA=0.3, 100 W halogen light source). Current density-voltage characteristics of all devices were measured under AM1.5 G illumination using an Oriel Xe solar simulator, employing filters to cut off grating overtones. Corrected current density measurements were calculated after measuring external quantum efficiencies under short circuit conditions (Enli Technology QE-R3018). A calibrated monosilicon diode with known spectral response served as a reference. Averages over the best 12 devices measured were used to obtain the device statistics.

Results and Discussion

Assessing the Blu-Ray Pattern for Light Trapping:

The arrangement of nanostructures within a light-trapping layer dramatically affects how photon energy is coupled into the plasmonic and waveguide modes confined in the active layer of a solar cell[20]. FIGS. 1A-1D show the Fourier transforms of subwavelength features arranged in periodic, random, quasi-random, and Blu-ray patterns. The red (inner) and blue (outer) circles in Fourier space mark the k-values required to couple incoming light into the waveguide modes at the red- and blue-ends of the solar spectrum, respectively. Periodic (FIG. 1A) and random (FIG. 1B) patterns yield wavevectors that are too discretized and too diffuse, respectively. On the other hand, quasi-random patterns (FIG. 1C) can be optimized to yield Fourier spectra that are efficient at light trapping, but these patterns are typically prohibitively expensive to manufacture. In comparison, although still containing a periodic component, the pattern on a pre-written Blu-ray movie disc (FIG. 1D) produces a close-to-optimized distribution of k-values.

Figure 6:
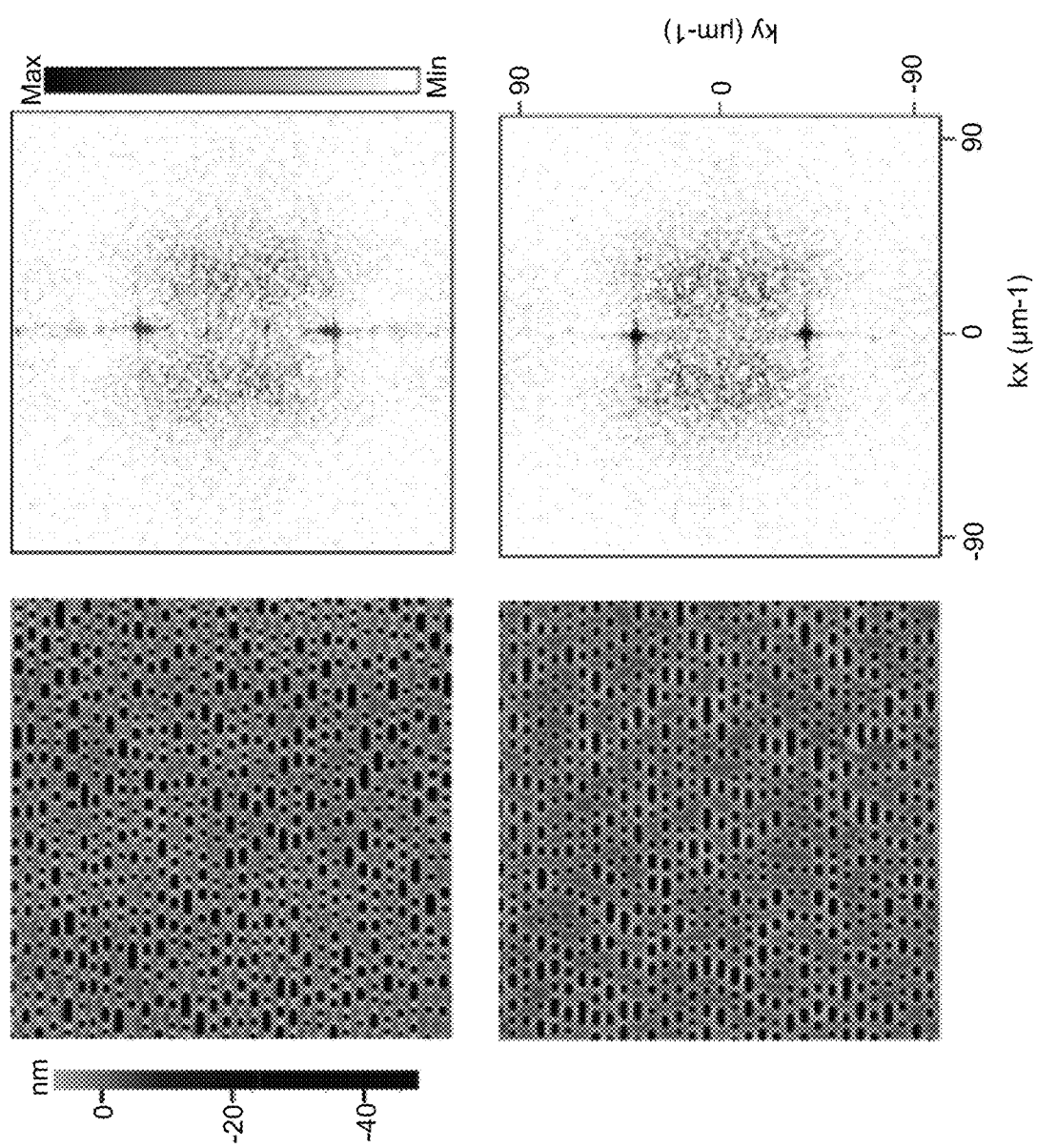
FIG. 6 shows the Fourier distributions of data from two separate areas of a Blu-ray disc. Fourier distributions of data from several other areas of the Blu-ray disc were also obtained. The Fourier transform of multiple AFM images of Blu-ray patterns (left images) all yield approximately the same distribution in Fourier-space.

The Blu-ray Disc (BD) standard[21] was developed for high-density optical data storage, and has proven popular for distributing high-definition movies. The BD standard specifies that the track pitch is 320 nm and the pits are 130 nm wide and a minimum of 150 nm long (see a representative atomic force microscopy (AFM) image in FIG. 4A). When writing to a disc, video signals are first compressed (e.g. MPEG4 format), resulting in a binary sequence with extremely high entropy per bit that is virtually indistinguishable from a random, uncorrelated sequence of bits[22]. When reading data from the disc, however, very short runs of successive zeros or ones yield low signal amplitudes, and very long runs are difficult to distinguish from noise due to scratches or fingerprints[21]. A modulation code (MC) is therefore applied to the data, preventing very short (i.e. high-frequency) and very long (i.e. low-frequency) runs of zeros or ones. Effectively, the MC-encoder transforms a random binary sequence into a quasi-random sequence with a tailored Fourier spectrum. As a result of the data compression and MC-encoder algorithms, data written to the disc results in a quasi-random, subwavelength pattern that is amazingly well suited for photon management over the solar spectrum, regardless of the movie content or area selected (See FIG. 6).

Figure 7B:
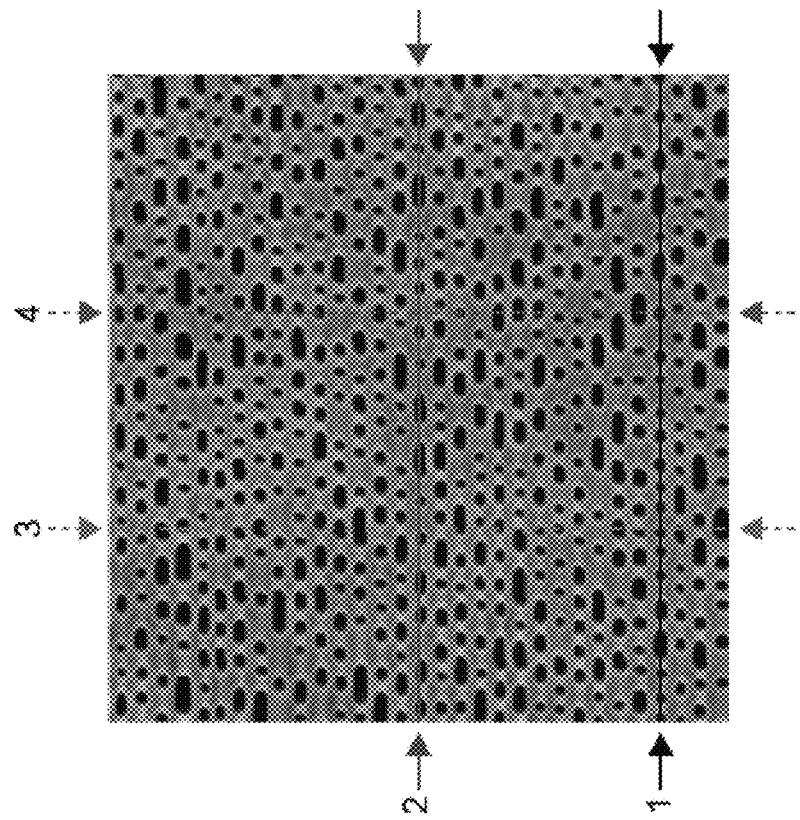
FIGS. 7A-7E show simulated absorption spectra of an example polymer solar cell imprinted with the Blu-ray pattern.
Figure 7A:
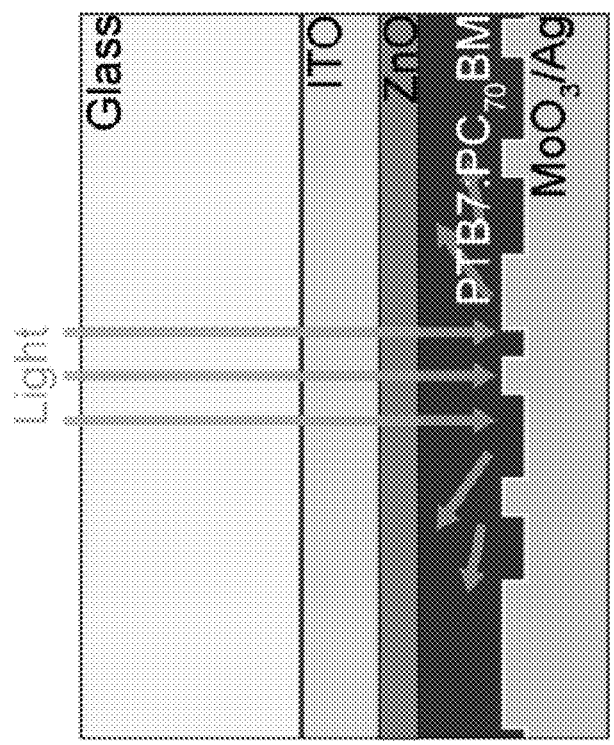
Figure 7C:
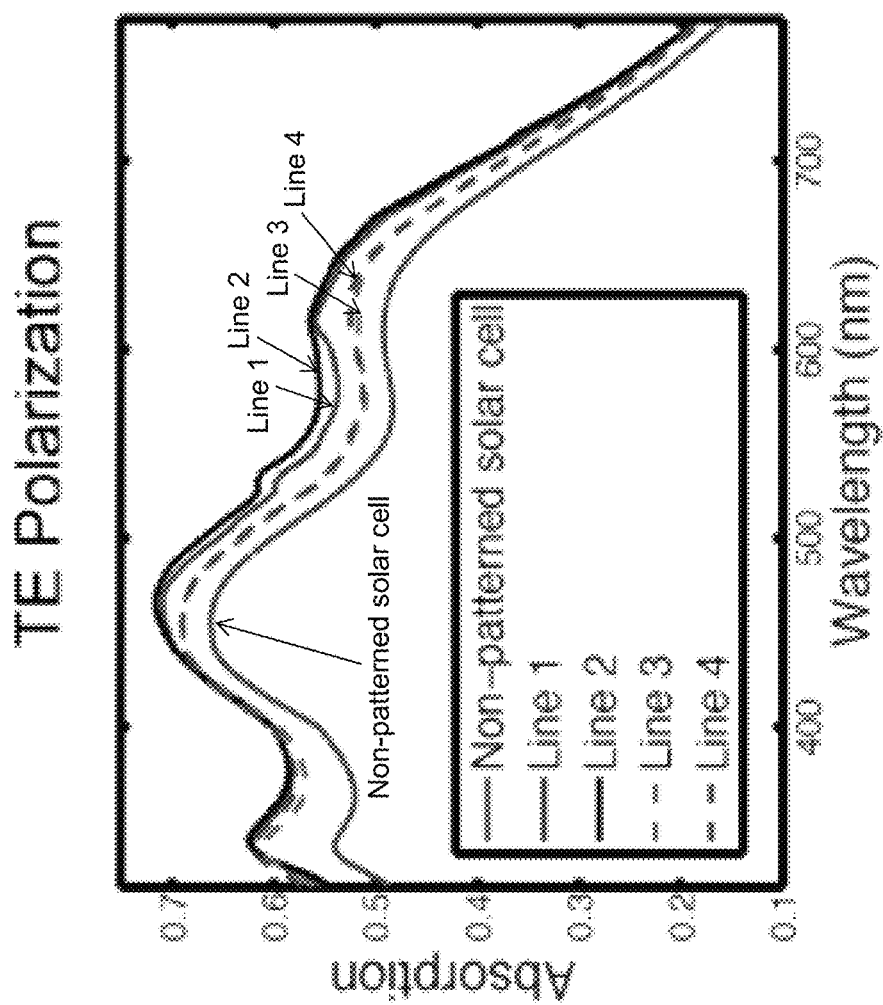
Figure 7D:
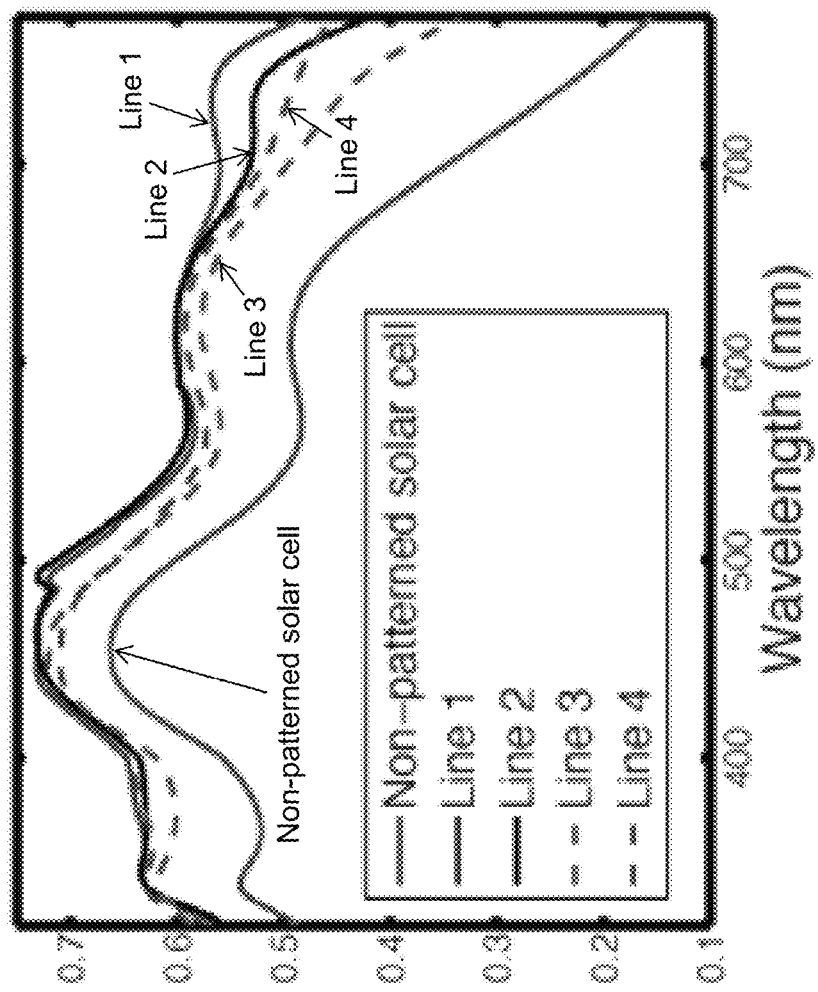
Figure 7E:
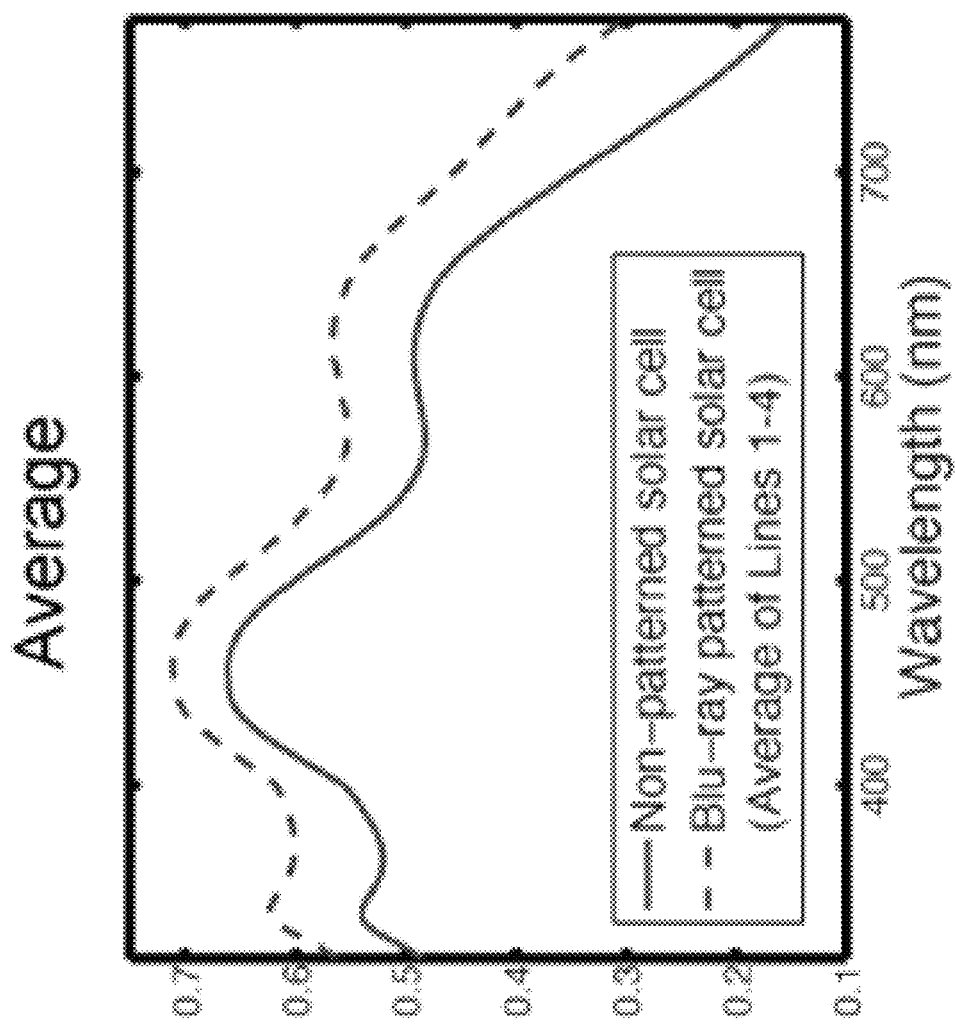

Simulated Active Layer Absorption:

The light trapping effect of the Blu-ray structure on a typical polymer solar cell with a $PTB7:PC_{71}BM$ active layer[23] (see FIG. 7A for the device structure) was numerically assessed by performing one-dimensional rigorous coupled-wave analysis (RCWA)[24]. The absorption was modeled both parallel and perpendicular to the track, as marked by the four lines on the AFM image shown in FIG. 7B. The corresponding absorption spectra from 315 nm to 775 nm was calculated both under transverse-electric (FIG. 7C) and transverse-magnetic (FIG. 7D) polarizations as referenced to the plane of the cross section. When compared to a non-patterned solar cell, the spectra of Blu-ray patterned devices display broadband enhancement under both polarization conditions[16,25,26]. Extremely high enhancement 113.9% can be found in the region between 700 nm to 775 nm for TM polarization, indicating the underlying importance of the light trapping effect in the weak absorption region of the active layer. The overall broadband absorption enhancement of a Blu-ray patterned device of 18.2% was calculated by averaging over the simulation results, as shown in FIG. 7E.

Figure 2C:
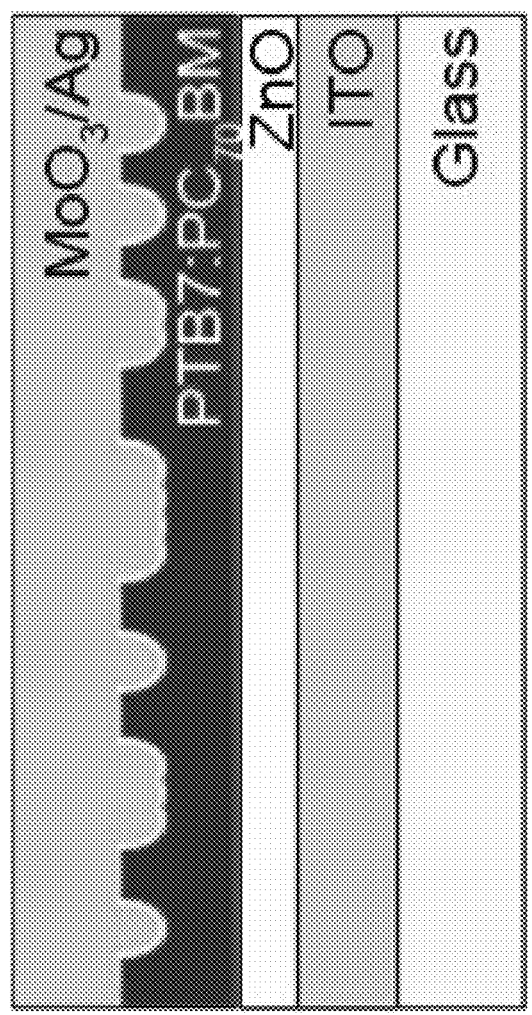

Device Fabrication and Characterization:

FIG. 2A illustrates the typical procedure for fabricating Blu-ray patterned polymer solar cells. The Blu-ray disc was first delaminated to expose the pattern of pits and lands, which was replicated on a polydimethylsiloxane (PDMS) stamp. The AFM image of the resulting stamp in FIG. 2B confirms that it is a high quality negative replica of the Blu-ray pattern with features as small as 150 nm across and 25 nm high. Next, the pattern was imprinted into a prefabricated polymer active layer by contact molding using the stamp, followed by electrode deposition to complete the device. The final device structure is illustrated in FIG. 2C.

Figure 3A:
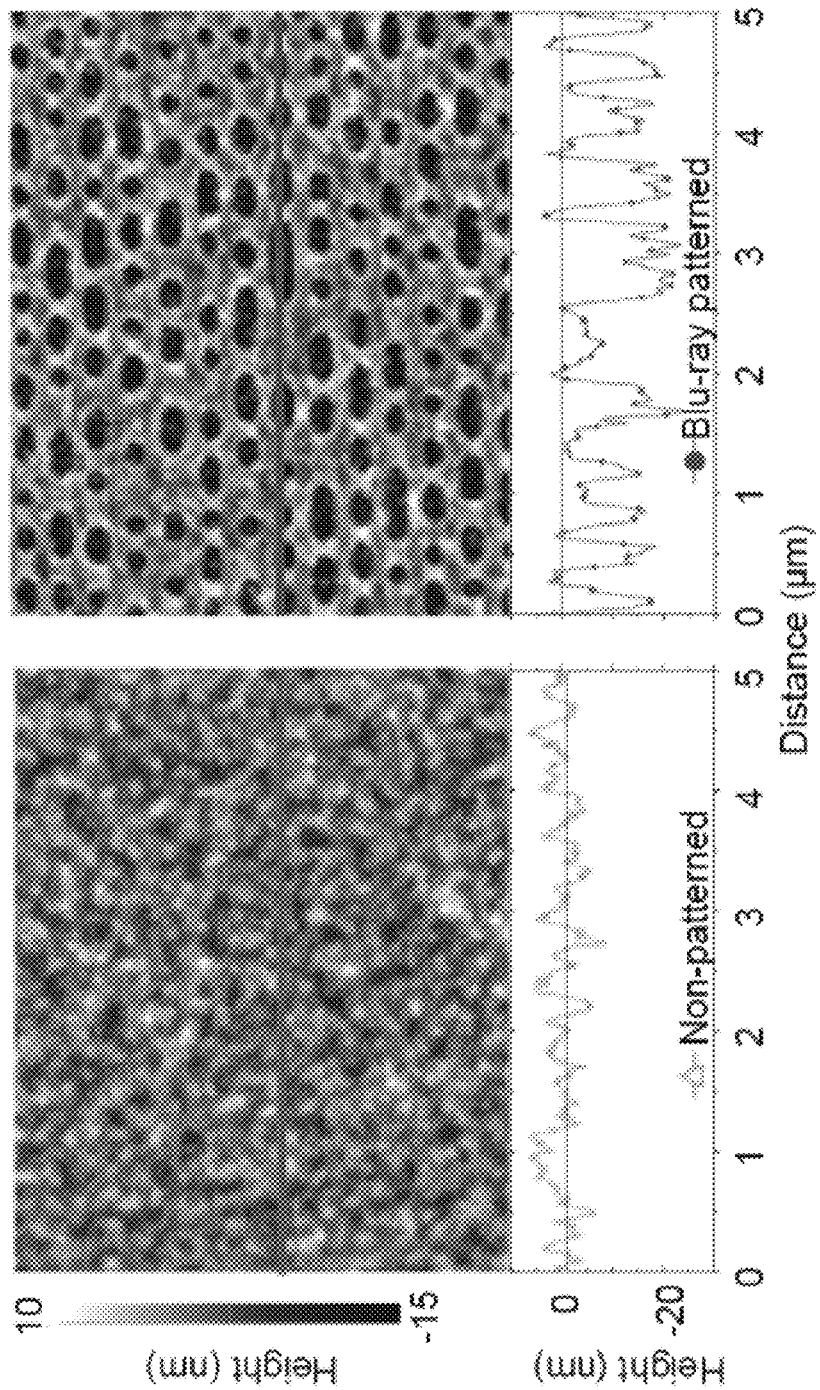
FIGS. 3A-3C show the physical morphology and performance characteristics of Blu-ray patterned solar cells.
Figure 3B:
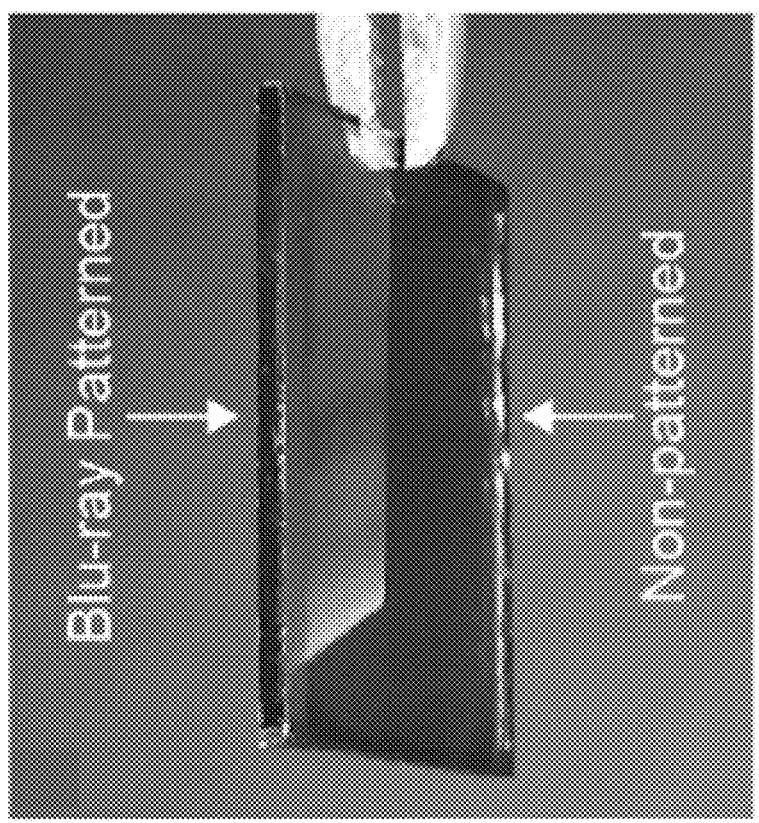
Figure 3C:
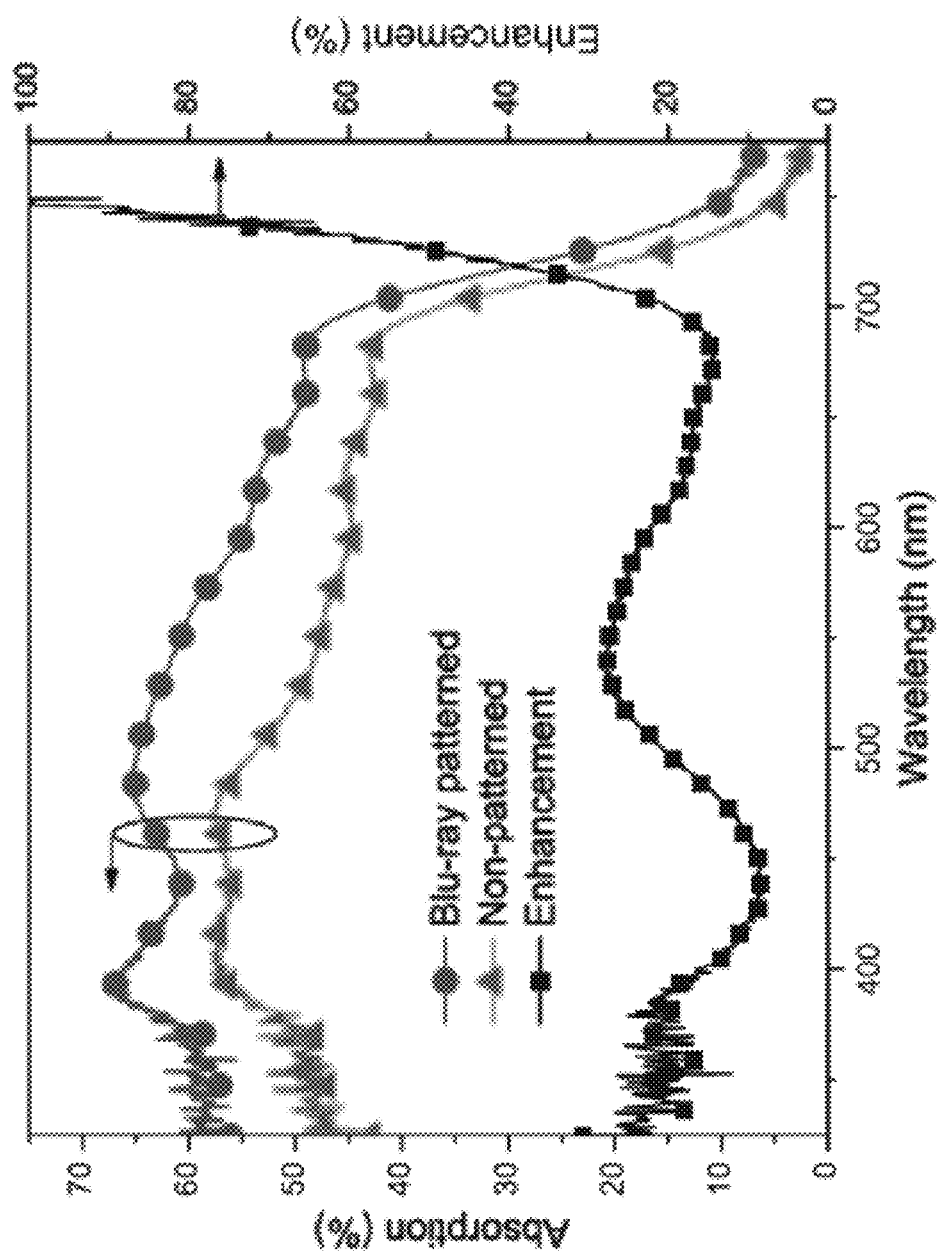
Figure 3D:
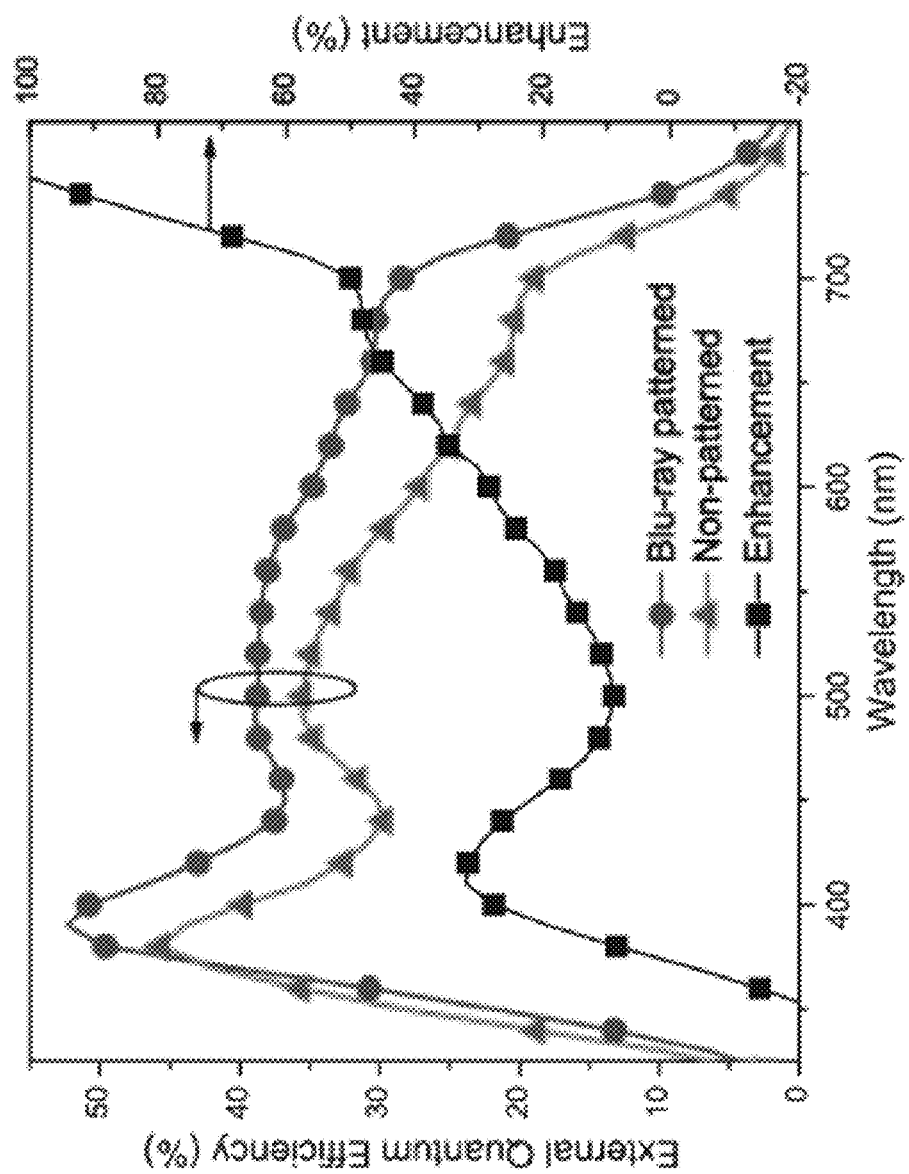
FIG. 3D shows that measured external quantum efficiencies (EQE) show a broadband enhancement and agree well with the calculated absorption spectrum in FIG. 3C.
Figure 8:
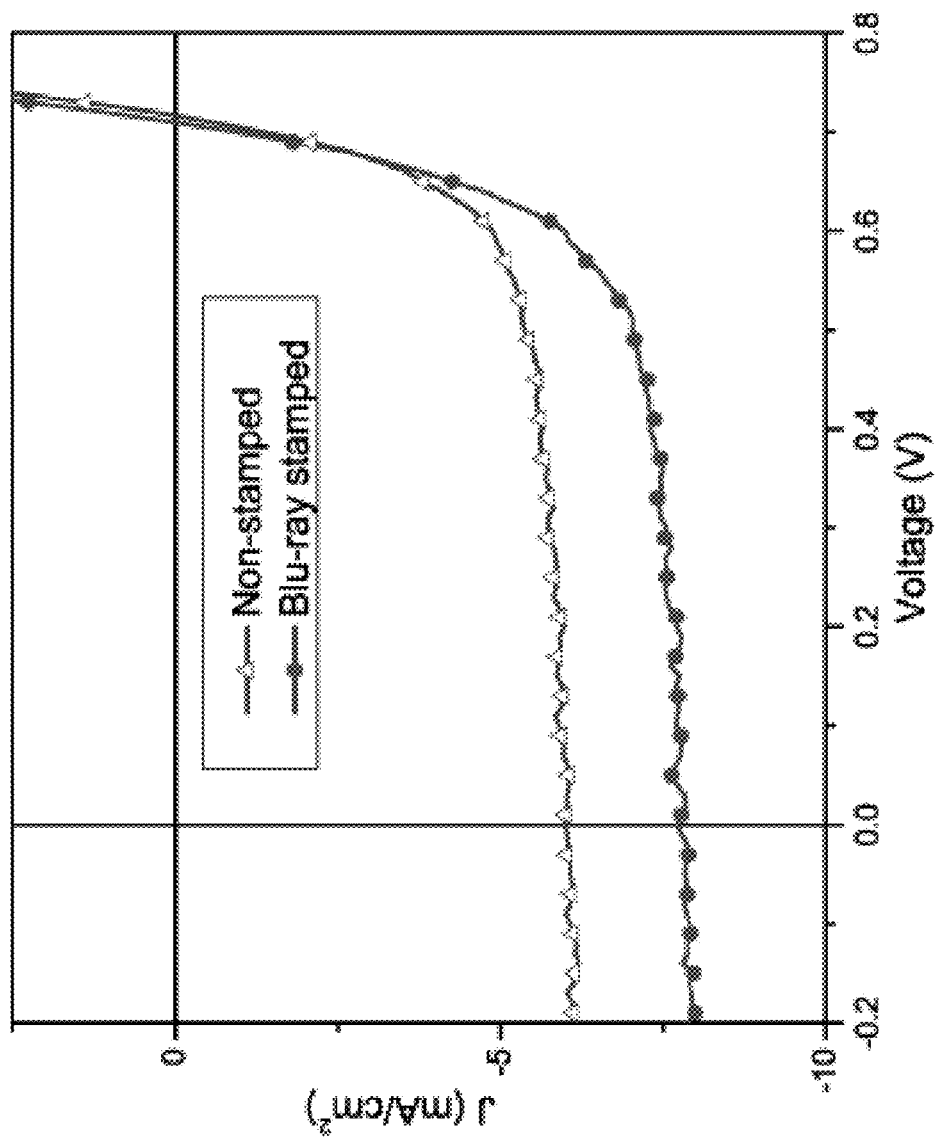
FIG. 8 shows solar cell characterization. Characteristic current-density vs. voltage plots for non-stamped and Blu-ray stamped PTB7:$PC_{71}BM$ solar cells with an active layer thickness of 50 nm are shown.

The AFM images in FIG. 3A clearly show successful transfer of the Blu-ray pattern to the active layer after nanoimprinting, in stark contrast with a non-patterned active layer. Line scans (FIG. 3A, bottom) show that the feature sizes are highly consistent with those of both the stamp and the original Blu-ray disc. The transferred pattern (c.a. 1 cm$^2$) displayed uniform iridescent reflection (FIG. 3B), demonstrating the reliability of this nanoimprinting process over large areas. The reflection (R) spectra of both non-patterned and Blu-ray patterned solar cells were measured and plotted 1-R, i.e. absorption in FIG. 3C. The absorption of the Blu-ray imprinted cell is significantly enhanced by 21.8% over the entire absorption profile. Notably, the benefit of light trapping is most pronounced after 700 nm, reaching 49.0%, where the material absorbs weakly. Both observations are consistent with the simulation shown in FIGS. 7A-E. The enhanced broadband absorption of Blu-ray patterned solar cells indeed led to improved external quantum efficiencies (EQE) (FIG. 3D). The overall EQE enhancement averaged over the entire absorption profile is 30.8%, while the averaged enhancement is 85.0% for wavelengths greater than 700 nm. As a result, the patterned cells delivered 16.9% higher short-circuit current densities ($J_{sc}$), eventually leading to a power conversion efficiency enhancement of 11.9% (See FIG. 8 and Table 1, below, for detailed performance results). Although higher $J_{sc}$ values have been reported for PTB7:PC$_{71}$BM solar cells with thicker active layers (~100 nm)[23], in the current example, an active layer thickness of 50 nm was chosen to best demonstrate the light trapping effect while avoiding shorting caused by imprinting with the 25 nm deep pattern. However, the depth of the pits could be modified during the mold fabrication step (e.g. via etching) to accommodate the needs of alternative thicknesses for device optimization.

TABLE 1

Solar cell performance. $J_{sc}$, $V_{oc}$, fill factor (FF), efficiency and corresponding enhancement factor of the all devices, including control devices stamped with the flat mold. The error values signify one standard deviation.

| Sample | $J_{sc}$ (mA cm$^{-2}$) | $V_{oc}$ (V) | FF | Efficiency (%) |
|---|---|---|---|---|
| Blu-ray | −7.16 ± 0.48 | 0.720 ± 0.012 | 68.2 ± 2.14 | 3.51 ± 0.33 |
| Flat-"patterned" | −5.92 ± 0.15 | 0.711 ± 0.023 | 68.1 ± 1.29 | 2.87 ± 0.34 |
| Non-patterned | −6.13 ± 0.32 | 0.728 ± 0.012 | 70.4 ± 2.45 | 3.13 ± 0.30 |
| Enhancement (%) | | | | |
| Blu-ray/Flat | 20.88 ± 1.49 | 1.3 ± 0.05 | 0.1 ± 0.00 | 22.4 ± 3.34 |
| BluRay/Non-stamped | 16.85 ± 1.43 | −1.0 ± 0.02 | −3.2 ± 0.15 | 11.9 ± 1.58 |

Figure 9A:
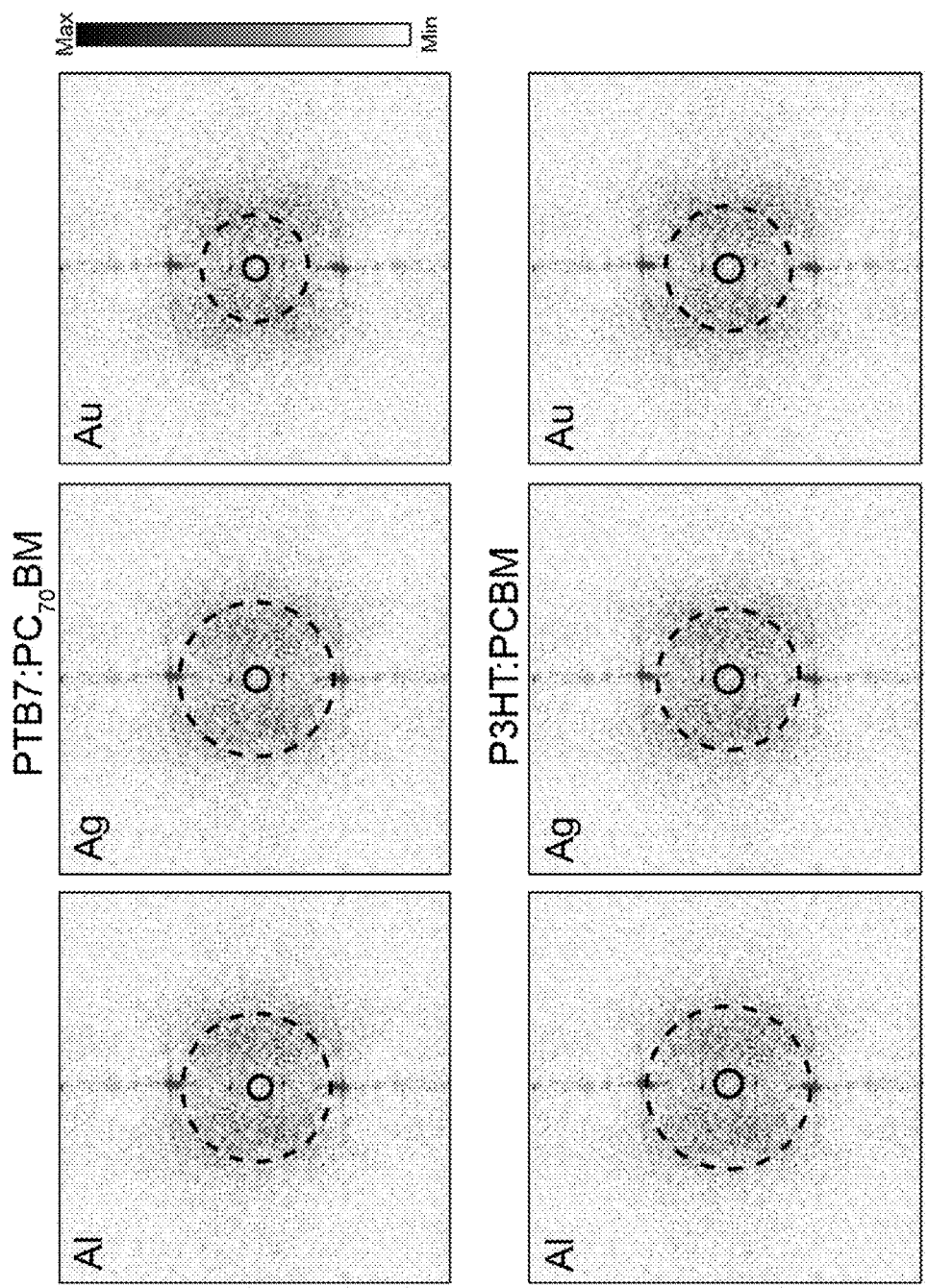
FIGS. 9A-9C show an assessment of Blu-ray pattern for other solar cell materials. Each box shows the Fourier transform of the Blu-ray pattern at the interfaces of active layers of different photoactive materials (PTB7:$PC_{70}BM$ (FIG. 9A), P3HT:PCBM (FIG. 9A); amorphous silicon (FIG. 9B); perovskite (FIG. 9B); CdTe (FIG. 9C); GaAs (FIG. 9C)) and electrodes of different materials (Al; Ag; Au). See FIG. 9C for axes labels. The circles denote the largest (outer) and smallest (inner) k-values needed to couple the entire solar spectrum (315 nm to 2.5 µm) to surface plasmons at the interface between the various photoactive and electrode materials.
Figure 9B:
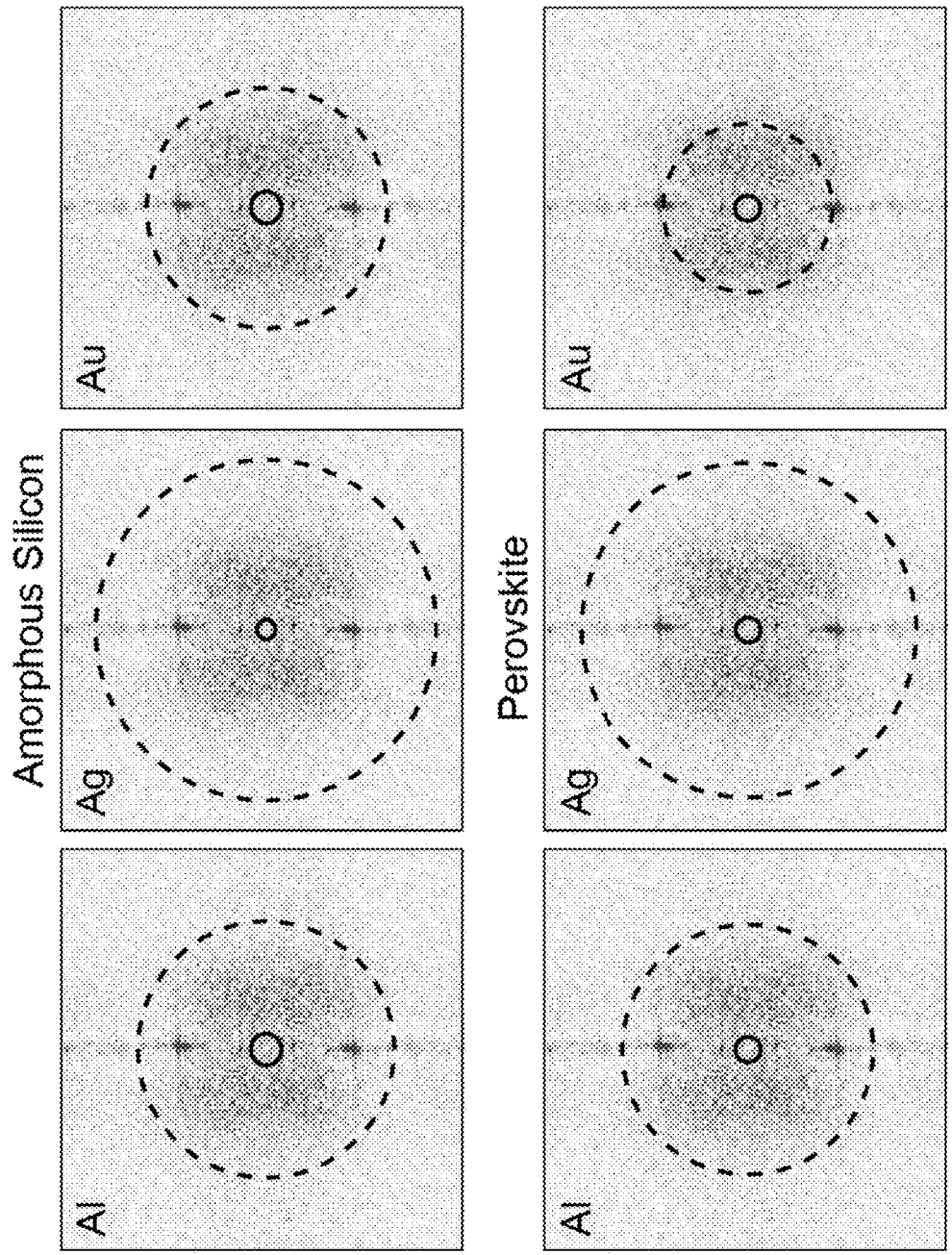
Figure 9C:
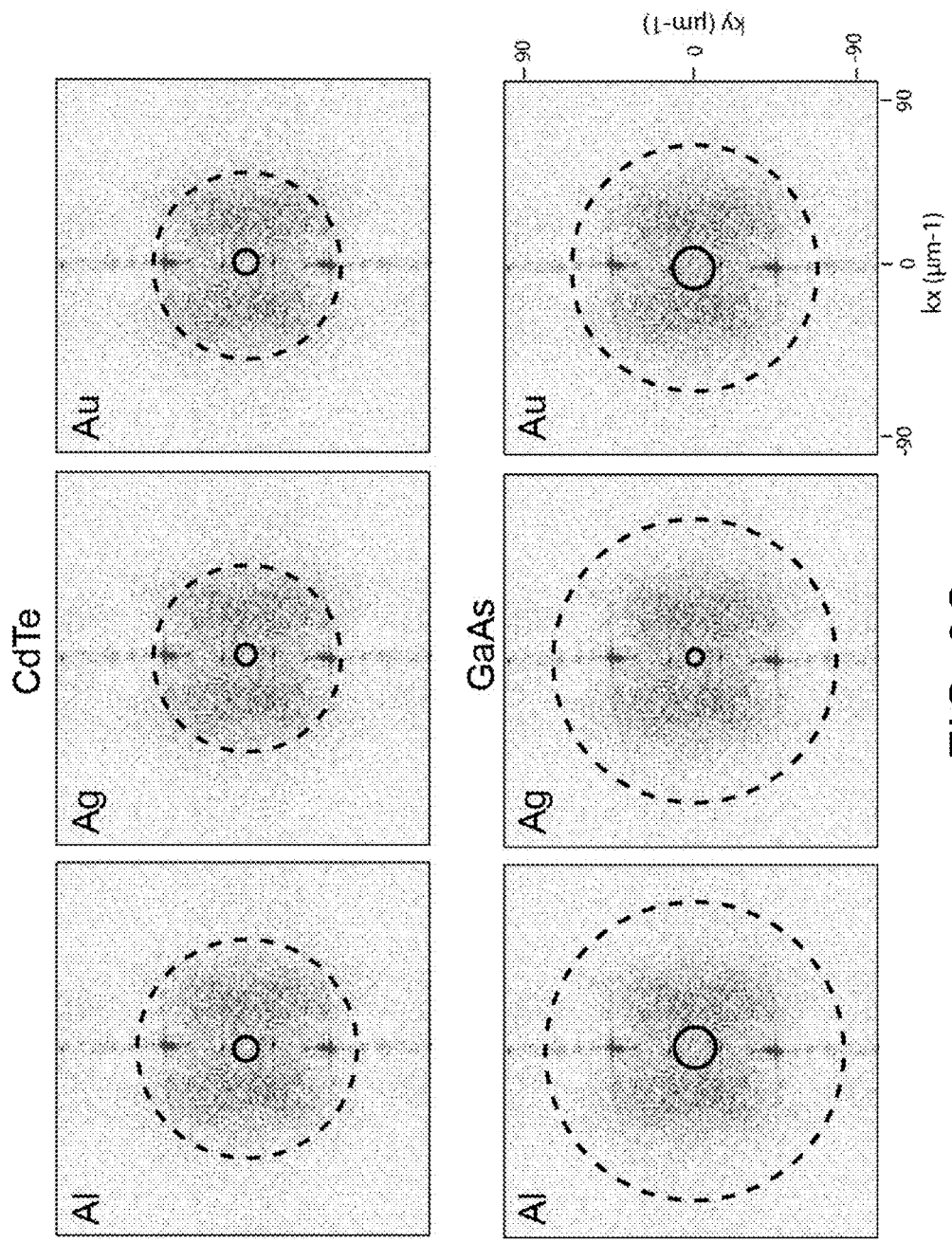

This example demonstrates the use of pre-written, Blu-ray movie discs as extremely low-cost nanoimprinting templates for creating photon management nanostructures in thin film solar cells. Mode analysis (FIGS. 9A-9C) demonstrates that the Blu-ray patterns can be broadly applied for light trapping in other types of solar cells, including those made with amorphous Si, III-V and II-VI semiconductors, and perovskite compounds. In contrast to previous attempts to make use of the periodic micro-/nanostructures in blank optical storage media[27-29], this example makes use of the quasi-random patterns in information-laden discs and demonstrates that the repurposing of a low cost consumer product leads to much higher-end, value-added applications.

Example 2: Optical Disc Nanopattern Manipulation

Introduction

Surface nanopatterns, such as periodic, random, and quasi-random patterns, are useful for photon management applications such as waveguides and light trapping. However, periodic patterns that couple to discrete peaks in Fourier space, and random patterns that scatter over a large range of Fourier space both have limited applicability because of their limited tunability. By contrast, quasi-random (QR) patterns can be designed to have feature sizes that couple to specific photon energy ranges, while still displaying a high degree of randomness. However, such patterns are often expensive to produce.

As described in Example 1, the nanopatterns found within Blu-ray discs—and indeed all pre-written optical discs—are QR in nature along the read direction of the disc while being quasi-periodic in the radial direction. A simplified description of an algorithm for encoding media files onto optical discs (e.g. MPEG-4) is shown in FIG. 11A. In a first step, compression coding is applied to uncompressed media to provide a substantially random binary sequence. In a second step, a standard error control coding is applied to the substantially random binary sequence to transform it into a quasi-random binary sequence having a particular Fourier spectrum. The QR nature of optical disc nanopatterns results from the error-control portion of the algorithm. Error controlling prevents patterns from being written to the disc that may cause read errors, such as a very long string of consecutive bits or strings of rapidly alternating bits. This error control coding ensures the length of pits and lands falls within a specified size range, thus creating a QR sequence. FIG. 11B shows the pattern of a recording layer of a blank/rewritable optical disc (top) and its corresponding Fourier spectrum (bottom). FIG. 11C shows the pattern of a recording layer of a pre-written optical disc (top) and its corresponding Fourier spectrum. When compared to blank optical discs, pre-written optical discs have rich Fourier spectra in the x-direction. In Example 1, it was shown that the Fourier response of pre-written Blu-ray discs is well matched for coupling light into the waveguide modes in a prototypical solar cell, increasing the device efficiency. However, the industry standard error control coding algorithms create the same Fourier responses from every disc, regardless of the original data written.

This example demonstrates manipulation of optical disc patterns by overlaying multiple patterns (FIGS. 11D-11E), tuning the allowed nanofeature size ranges (FIGS. 11F-11G), and varying the track spacing (FIGS. 11H-11I). The resulting polarization-independent, highly tunable Fourier transforms may be applied to myriad photon management applications, while still maintaining many of the advantages of the original mass-produced optical disc formats.

Methods

Simulations were carried out in Matlab. The simulations were based on the feature sizes dictated by the Blu-ray Disc standard—each bit, corresponding to part of a pit or land, was assumed to be 75 nm long and 130 nm wide with a track pitch of 320 nm—and scaled linearly to approximate the conversion to DVD and CD standards. It should be noted that the minimum number of contiguous bits to make a pit or land is two, so the minimum length of either a pit or land is 150 nm. In this example, it was assumed the length (L) distribution of pits and lands followed a l/L distribution with the minimum feature length equal to 2 and the maximum equal to 7. Fourier transforms of these images were calculated, as shown in FIGS. 11B, 11C, 11E, 11G, and 11I, using the FFT function. On rewritable Blu-ray discs, the physical structure of the disc doesn't change upon writing, with the information instead being encoded in a phase-transformation or dye material, so they were simulated as alternating rows of pits and lands. Images were overlaid using Boolean algebra and then cropped to remove areas of only partial overlay.

Results and Discussion

The nanopatterns found within pre-written optical discs were simulated as two-dimensional binary images and their corresponding Fourier transforms were computed, as detailed in the Methods section above and shown in FIG. 11C. One limitation of the optical disc pattern of FIG. 11C is its polarization dependence, since it is only QR in the read direction. In order to reduce the polarization-dependence, three simulated images were overlaid, with two of the images rotated at 60° and 120° with respect with the first (original) image, using binary addition to achieve the image shown in FIG. 11E (top). The resulting Fourier transform in FIG. 11E (bottom) is a rotationally symmetric ring that is nearly polarization-independent for incoming light, with some remnant periodicity seen from the first order peaks at multiples of 60°. More images may be overlaid to increase the rotational symmetry.

Further control over the FT is exerted by controlling the data written to the disc. By restricting the size of the nanofeatures to a narrow distribution, the Fourier response is limited to a narrow band. When these patterns are overlaid, a narrow ring in Fourier space is observed, which corresponds to a narrow band of photon energies being manipulated. Such rings are frequently observed in X-ray spectra (i.e. the FT) of creatures that exhibit structural coloration, such as brightly colored bird feathers. The size of this ring—and thus the manipulated photon energies—can be tuned by tuning the distribution of the feature sizes of the nanopattern. By way of illustration, the real-space images (top row) and Fourier space images (bottom row) of FIG. 11F demonstrate the effect of the contiguous length of pits and lands on the Fourier transform. They show (left-most) 2 or 3 contiguous bits (next adjacent) 4 or 5 contiguous bits, (next adjacent) 6 or 7 contiguous bits, and (right-most) 8, 9, . . . 20 contiguous bits forming pits and lands. Smaller features (i.e. fewer contiguous bits) create patterns in Fourier space that are further from the central vertical line along which the first and second order diffraction peaks fall. The pattern in the left-most image was overlaid three times to create the image shown in FIG. 11G (top). The ring shown in FIG. 11G (bottom) was optimized so that the ring overlaid with the first order diffraction peak that results from the track periodicity.

By further modulating the track periodicity, it is possible to shift the placement of the first order peaks. By using quasi-random spacing between tracks, the periodicity due to the tracks can be eliminated, instead resulting in a blurred out vertical line. By completely eliminating the track spacing, the periodicity of the patterns can be further reduced. By way of illustration, the real-space images (top row) and Fourier space images (bottom row) of FIG. 11H demonstrate the effect of track spacing on the diffraction peaks. Each of the images uses 6-7 contiguous bits, as shown in FIG. 11F (second from the left image). They show that a track spacing dictated by a typical optical disc standard yields primary, secondary, and higher order diffraction peaks as shown in the Fourier transform, which are caused by the track spacing (left-most image). By increasing the track spacing by a factor of 3, the diffraction peaks move closer to the center of the Fourier space, as shown in the next adjacent image. This change in diffraction peak location is beneficial when images are overlaid, as the diffraction peaks can be made to lie on the circle. It should be clear to see that changing the track spacing to be the same size as the median feature size (e.g. the length of the 6-7 bit features in this case) causes the first order diffraction peaks to overlay on the circle. This pattern was overlaid 5 times in order to make the pattern shown in FIG. 11I. As shown in the next adjacent image in FIG. 11H, by assigning a random track spacing (in this case the vertical spacing between pits and lands is allowed to range between 0 and 3 times the typical spacing), the diffraction peaks become undefined and smeared out along the vertical central line. Finally, as shown in the right-most image, by setting the track spacing to zero, the diffraction peaks due to the track disappear and only the diffraction peaks due to the pit and land width is evident in the Fourier transform.

The industry-standard error-control algorithms used to write optical discs create the same QR Fourier response regardless of disc content. The optical disc nanopattern manipulation techniques described in this Example liberate optical disc formats for a wider range of photon management applications beyond their intended use. Indeed, these techniques allow for similar tunability (e.g. the shape of the Fourier response) afforded by other deterministic methods of creating QR patterns, such as spinodal decomposition. However, other QR pattern generation techniques typically require low-throughput fabrication techniques such as electron beam lithography and require either tiled images or very large file inputs. Further, the techniques described in this Example allow for enhanced control for coupling to many material combinations with a wide range of optical properties, and over much of the solar spectrum. Finally, the techniques described in this Example, particularly the data-manipulation and track-modulation modifications, are compatible with current optical disc production techniques. Current industrial capabilities for optical disc manufacturing are enormous, yet media content is increasingly distributed via online downloads and streaming rather than via optical discs. Example 1 involved repurposing optical discs for a myriad of value-added applications related to photon management. This Example involves repurposing the manufacturing equipment used to make optical discs for such value-added applications.

REFERENCES

1 Vardeny, Z. V., Nahata, A. & Agrawal, A. Optics of photonic quasicrystals. *Nat Photonics* 7, 177-187, doi:Doi 10.1038/Nphoton.2012.343 (2013).
2 Wiersma, D. S. Disordered photonics. *Nat Photonics* 7, 188-196, doi:Doi 10.1038/Nphoton.2013.29 (2013).
3 Vynck, K., Burresi, M., Riboli, F. & Wiersma, D. S. Photon management in two-dimensional disordered media. *Nat Mater* 11, 1017-1022, doi:Doi 10.1038/Nmat3442 (2012).
4 Martins, E. R. et al. Deterministic quasi-random nanostructures for photon control. *Nat Commun* 4, doi:Artn 2665 Doi 10.1038/Ncomms3665 (2013).
5 Vukusic, P., Hallam, B. & Noyes, J. Brilliant whiteness in ultrathin beetle scales. *Science* 315, 348-348, doi:DOI 10.1126/science.1134666 (2007).
6 Dong, B. Q. et al. Optical response of a disordered bicontinuous macroporous structure in the longhorn beetle Sphingnotus mirabilis. *Phys Rev E* 84, doi:Artn 011915 Doi 10.1103/Physreve.84.011915 (2011).
7 Dufresne, E. R. et al. Self-assembly of amorphous biophotonic nanostructures by phase separation. *Soft Matter* 5, 1792-1795, doi:Doi 10.1039/B902775k (2009).
8 Koo, W. H. et al. Light extraction from organic light-emitting diodes enhanced by spontaneously formed buckles. *Nat Photonics* 4, 222-226, doi:Doi 10.1038/Nphoton.2010.7 (2010).
9 Forster, J. D. et al. Biomimetic Isotropic Nanostructures for Structural Coloration. *Adv Mater* 22, 2939-+, doi:DOI 10.1002/adma.200903693 (2010).
10 Conley, G. M., Burresi, M., Pratesi, F., Vynck, K. & Wiersma, D. S. Light Transport and Localization in Two-Dimensional Correlated Disorder. *Physical Review Letters* 112, 143901 (2014).
11 Noh, H. et al. Control of Lasing in Biomimetic Structures with Short-Range Order. *Physical Review Letters* 106, doi:Artn 183901Doi 10.1103/Physrevlett.106.183901 (2011).
12 Garnett, E. & Yang, P. D. Light Trapping in Silicon Nanowire Solar Cells. *Nano Lett* 10, 1082-1087, doi:Doi 10.1021/Nl100161z (2010).
13 Zhan, Y. H., Li, X. F. & Li, Y. Numerical Simulation of Light-Trapping and Photoelectric Conversion in Single Nanowire Silicon Solar Cells. *Ieee J Sel Top Quant* 19, doi:Doi 10.1109/Jstqe.2013.2246771 (2013).
14 Raman, A., Yu, Z. F. & Fan, S. H. Dielectric nanostructures for broadband light trapping in organic solar cells. *Opt Express* 19, 19015-19026 (2011).
15 Wang, K. X. Z., Yu, Z. F., Liu, V., Cui, Y. & Fan, S. H. Absorption Enhancement in Ultrathin Crystalline Silicon Solar Cells with Antireflection and Light-Trapping Nanocone Gratings. *Nano Lett* 12, 1616-1619, doi:Doi 10.1021/Nl204550q (2012).
16 You, J. B. et al. Surface Plasmon and Scattering-Enhanced Low-Bandgap Polymer Solar Cell by a Metal Grating Back Electrode. *Adv Energy Mater* 2, 1203-1207 (2012).
17 Wang, C., Yu, S. C., Chen, W. & Sun, C. Highly Efficient Light-Trapping Structure Design Inspired By Natural Evolution. *Sci Rep-Uk* 3, doi:Artn 1025 Doi 10.1038/Srep01025 (2013).
18 Pala, R. A. et al. Optimization of non-periodic plasmonic light-trapping layers for thin-film solar cells. *Nat Commun* 4, doi:Artn 2095 Doi 10.1038/Ncomms3095 (2013).
19 Ferry, V. E. et al. Optimized Spatial Correlations for Broadband Light Trapping Nanopatterns in High Efficiency Ultrathin Film a-Si:H Solar Cells. *Nano Lett* 11, 4239-4245, doi:Doi 10.1021/N1202226r (2011).
20 Atwater, H. A. & Polman, A. Plasmonics for improved photovoltaic devices (vol 9, pg 205, 2010). *Nat Mater* 9, 865-865, doi:Doi 10.1038/Nmat2866 (2010).
21 Association, B.-r. D. "Blu-ray disc format," White Paper, 3rd ed. (December 2012).
22 Visweswariah, K., Kulkarni, S. R. & Verdu, S. Source codes as random number generators. *Ieee T Inform Theory* 44, 462-471, doi:Doi 10.1109/18.661497 (1998).
23 Liang, Y. et al. For the Bright Future—Bulk Heterojunction Polymer Solar Cells with Power Conversion Efficiency of 7.4%. *Adv Mater* 22, E135-E138, doi:10.1002/adma.200903528 (2010).
24 Li, L. F. Formulation and comparison of two recursive matrix algorithms for modeling layered diffraction gratings. *J Opt Soc Am A* 13, 1024-1035, doi:Doi 10.1364/Josaa.13.001024 (1996).
25 Battaglia, C. et al. Light Trapping in Solar Cells: Can Periodic Beat Random? *Acs Nano* 6, 2790-2797, doi:Doi 10.1021/Nn300287j (2012).
26 Brongersma, M. L., Cui, Y. & Fan, S. H. Light management for photovoltaics using high-index nanostructures. *Nat Mater* 13, 451-460, doi:Doi 10.1038/Nmat3921 (2014).
27 Yu, H. Z., Li, Y. C. & Ou, L. M. L. Reading Disc-Based Bioassays with Standard Computer Drives. *Accounts Chem Res* 46, 258-268, doi:Doi 10.1021/Ar300104b (2013).
28 Baba, A., Wakatsuki, K., Shinbo, K., Kato, K. & Kaneko, F. Increased short-circuit current in grating-coupled surface plasmon resonance field-enhanced dye-sensitized solar cells. *Journal of Materials Chemistry* 21, 16436-16441, doi:10.1039/C1JM12935J (2011).
29 Baba, A., Aoki, N., Shinbo, K., Kato, K. & Kaneko, F. Grating-Coupled Surface Plasmon Enhanced Short-Circuit Current in Organic Thin-Film Photovoltaic Cells. *ACS Applied Materials & Interfaces* 3, 2080-2084, doi:10.1021/am200304x (2011).
30 Luck, K. A. et al. Improved uniformity in high-performance organic photovoltaics enabled by (3-aminopropyl) triethoxysilane cathode functionalization. *Phys Chem Chem Phys* 15, 20966-20972, doi:Doi 10.1039/C3cp54623c (2013).
25 Battaglia, C. et al. Light Trapping in Solar Cells: Can Periodic Beat Random? *Acs Nano* 6, 2790-2797, doi:Doi 10.1021/Nn300287j (2012).
26 Brongersma, M. L., Cui, Y. & Fan, S. H. Light management for photovoltaics using high-index nanostructures. *Nat Mater* 13, 451-460, doi:Doi 10.1038/Nmat3921 (2014).

27 Yu, H. Z., Li, Y. C. & Ou, L. M. L. Reading Disc-Based Bioassays with Standard Computer Drives. *Accounts Chem Res* 46, 258-268, doi:Doi 10.1021/Ar300104b (2013).

28 Baba, A., Wakatsuki, K., Shinbo, K., Kato, K. & Kaneko, F. Increased short-circuit current in grating-coupled surface plasmon resonance field-enhanced dye-sensitized solar cells. *Journal of Materials Chemistry* 21, 16436-16441, doi:10.1039/C1JM12935J (2011).

29 Baba, A., Aoki, N., Shinbo, K., Kato, K. & Kaneko, F. Grating-Coupled Surface Plasmon Enhanced Short-Circuit Current in Organic Thin-Film Photovoltaic Cells. *ACS Applied Materials & Interfaces* 3, 2080-2084, doi: 10.1021/am200304x (2011).

30 Luck, K. A. et al. Improved uniformity in high-performance organic photovoltaics enabled by (3-aminopropyl) triethoxysilane cathode functionalization. *Phys Chem Chem Phys* 15, 20966-20972, doi:Doi 10.1039/C3cp54623c (2013).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A photonic device comprising a photoactive layer and at least one additional layer, wherein a surface of the photoactive layer or a surface of the at least one additional layer has imprinted thereon a quasi-random pattern of nanostructures corresponding to a quasi-random pattern of nanostructures defined in a recording layer of an optical media disc, wherein the quasi-random pattern of nanostructures defined in the recording layer of the optical media disc and the imprinted surface comprises a plurality of pits and lands arranged in a plurality of tracks, each track comprising both pits and lands, the tracks aligned along their longitudinal axes.

2. The photonic device of claim 1, wherein the quasi-random pattern of nanostructures defined in the recording layer of the pre-written optical media disc and the imprinted surface is configured according to an optical data storage format, the optical data storage format characterized by one, two, or all three of: a pit width of about 130 nm, a minimum pit length of about 150 nm, and a track pitch of about 320 nm.

3. The photonic device of claim 2, wherein the optical data storage format is characterized by the pit width of about 130 nm, the minimum pit length of about 150 nm, and the track pitch of about 320 nm.

4. The photonic device of claim 1, wherein the quasi-random pattern of nanostructures defined in the recording layer of the optical media disc and the imprinted surface is a stacked quasi-random pattern of nanostructures comprising the quasi-random pattern of nanostructures comprising the plurality of pits and lands arranged in the plurality of tracks, the tracks aligned along their longitudinal axes, which is configured according to a first optical data storage format, and at least one additional overlying quasi-random pattern of nanostructures comprising a plurality of pits and lands arranged in a plurality of tracks, the tracks aligned along their longitudinal axes, which is configured according to a second optical data storage format.

5. The photonic device of claim 4, wherein an angle θ defined by the longitudinal axes of the tracks of the at least one additional overlying quasi-random pattern of nanostructures relative to the longitudinal axes of the tracks of the quasi-random pattern of nanostructures is in the range of 0°<θ<360°.

6. The photonic device of claim 5, wherein the quasi-random pattern of nanostructures and the at least one additional overlying quasi-random pattern of nanostructures are configured according to the same optical data storage format.

7. The photonic device of claim 6, wherein the same optical data storage format is an optical data storage format characterized by one, two, or all three of: a pit width of about 130 nm, a minimum pit length of about 150 nm, and a track pitch of about 320 nm.

8. The photonic device of claim 7, wherein the same optical data storage format is characterized by the pit width of about 130 nm, the minimum pit length of about 150 nm, and the track pitch of about 320 nm.

9. A photovoltaic cell comprising a front electrode layer, a back electrode layer, and a photoactive layer between the front and back electrode layers, wherein a surface of a layer of the photovoltaic cell has imprinted thereon a quasi-random pattern of nanostructures corresponding to a quasi-random pattern of nanostructures defined in a recording layer of an optical media disc.

10. The photonic device of claim 9, wherein the imprinted surface is the surface of the photoactive layer.

11. The photonic device of claim 9, further comprising an electron transport layer between the front and back electrode layers.

12. The photonic device of claim 1, wherein the quasi-random pattern of nanostructures defined in the recording layer of the optical media disc and the imprinted surface is configured to provide a Fourier response characterized by a distribution of k-values which couples sunlight having wavelengths in the range of from about 315 nm to about 2.5 μm to surface plasmons at an interface between the imprinted surface and an overlying layer of the photonic device.

13. The photonic device of claim 12, wherein the distribution of k-values couples sunlight having wavelengths in the range of from about 315 nm to about 775 nm.

* * * * *